United States Patent [19]

Bodrug et al.

[11] Patent Number: 4,902,965
[45] Date of Patent: Feb. 20, 1990

[54] CONSUMPTION METER FOR ACCUMULATING DIGITAL POWER CONSUMPTION SIGNALS VIA TELEPHONE LINES WITHOUT DISTURBING THE CONSUMER

[76] Inventors: John D. Bodrug, 360 Bloor Street E., Apt. 601, Toronto, Ontario, Canada, M4W 3M3; Melvin J. Bradford, 43 Hettersley Drive, Ajax, Ontario, Canada, L1T 1S1; Robert R. Freeman, 485 Waverly St. N., Oshawa, Ontario, Canada, L1J 5W5

[21] Appl. No.: 62,456

[22] Filed: Jun. 15, 1987

[51] Int. Cl.[4] ............... G01R 11/00; G01R 21/06; H04M 11/08
[52] U.S. Cl. ................... 324/116; 324/142; 364/483; 379/107; 340/870.02
[58] Field of Search ............... 324/141, 116, 103 R, 324/109, 142, 139; 364/483; 340/637, 657, 870.02; 379/107, 100, 93, 82

[56] References Cited

U.S. PATENT DOCUMENTS

| | | | |
|---|---|---|---|
| 3,875,508 | 4/1975 | Milkovic | 324/142 X |
| 3,937,889 | 2/1976 | Bell, III et al. | 379/107 X |
| 3,937,890 | 2/1976 | Blethen et al. | 379/107 X |
| 3,959,724 | 5/1976 | Chana et al. | 324/142 X |
| 4,079,313 | 3/1978 | Callan | 324/142 X |
| 4,224,671 | 9/1980 | Sugiyama et al. | 324/142 X |
| 4,345,311 | 8/1982 | Fielden | 324/142 X |
| 4,394,540 | 7/1983 | Willis et al. | 379/107 X |
| 4,442,492 | 4/1984 | Karlsson et al. | 324/142 X |
| 4,485,343 | 11/1984 | Milkovic | 324/142 X |
| 4,486,625 | 12/1984 | Reinauer et al. | 379/107 X |
| 4,495,463 | 1/1985 | Milkovic | 324/142 X |
| 4,535,287 | 8/1985 | Milkovic | 324/142 X |
| 4,663,778 | 5/1987 | Takahashi | 379/100 |
| 4,680,706 | 7/1987 | Bray | 364/483 X |
| 4,686,460 | 8/1987 | Stevens et al. | 324/142 X |
| 4,701,698 | 10/1987 | Karlsson et al. | 324/116 X |
| 4,707,852 | 11/1987 | Jahr et al. | 379/107 X |
| 4,720,851 | 1/1988 | Smith | 340/870.02 X |

FOREIGN PATENT DOCUMENTS 0841793 5/1970 Canada.

Primary Examiner—Gerard R. Strecker
Assistant Examiner—Vinh P. Nguyen
Attorney, Agent, or Firm—Thomas A. O'Rourke

[57] ABSTRACT

A microprocessor controlled utility consumption meter is provided. The meter is to be associated with sensors for detecting the consumption of a utility and includes a real time clock operable to generate time signals to divide a predetermined time period into a plurality of intervals, the intervals defining critical and non-critical utility consumption times. A processor is also provided which communicates with the sensors and is responsive to the timing signals for storing the utility conmsumption for each of the intervals in the period. An accumulator accumulates the utility consumption for each of the intervals over a plurality of periods. The meter also includes an interface for allowing the accumulated utility consumption stored in the meter to the transmitted to a central computer for processing.

14 Claims, 16 Drawing Sheets

SINGLE PHASE INTERRUPT ROUTINE

FIG. 12    USER COMMAND ROUTINE

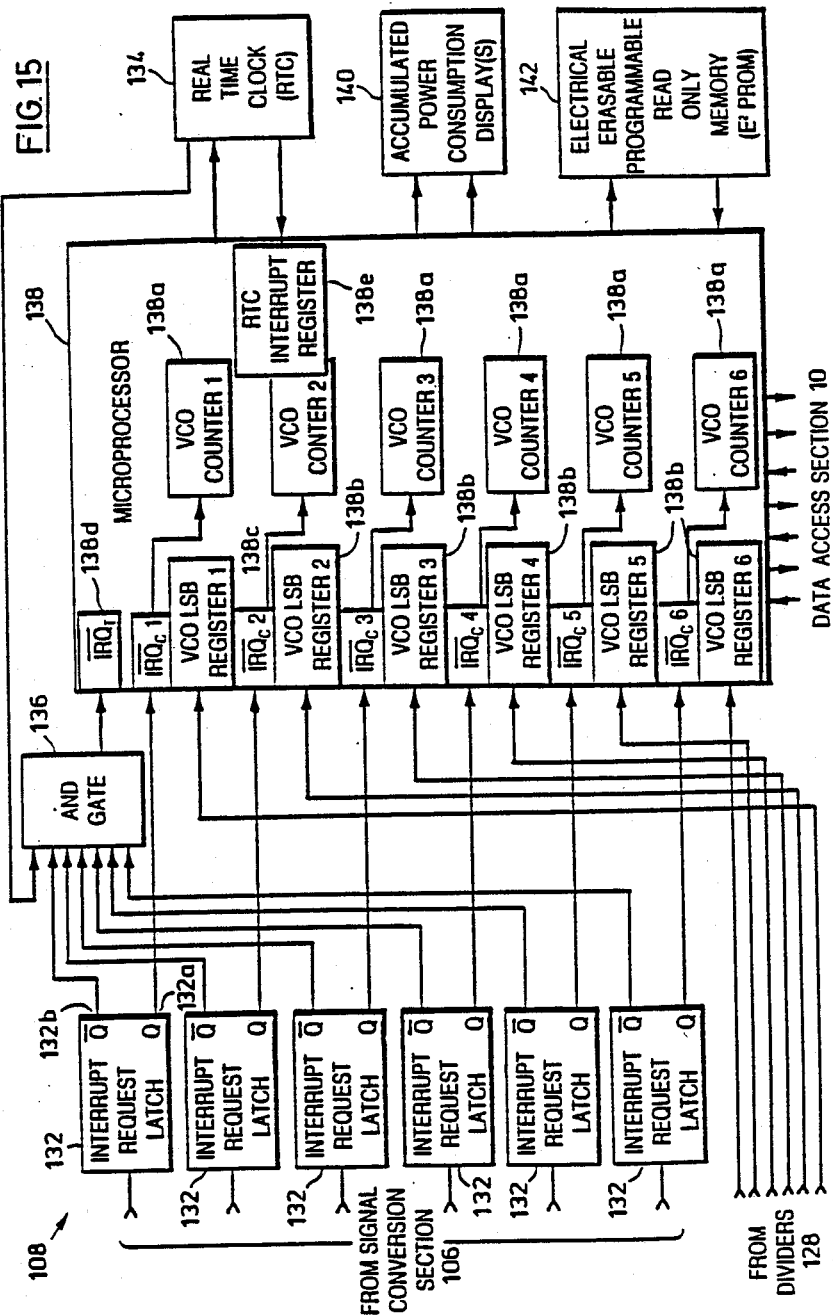

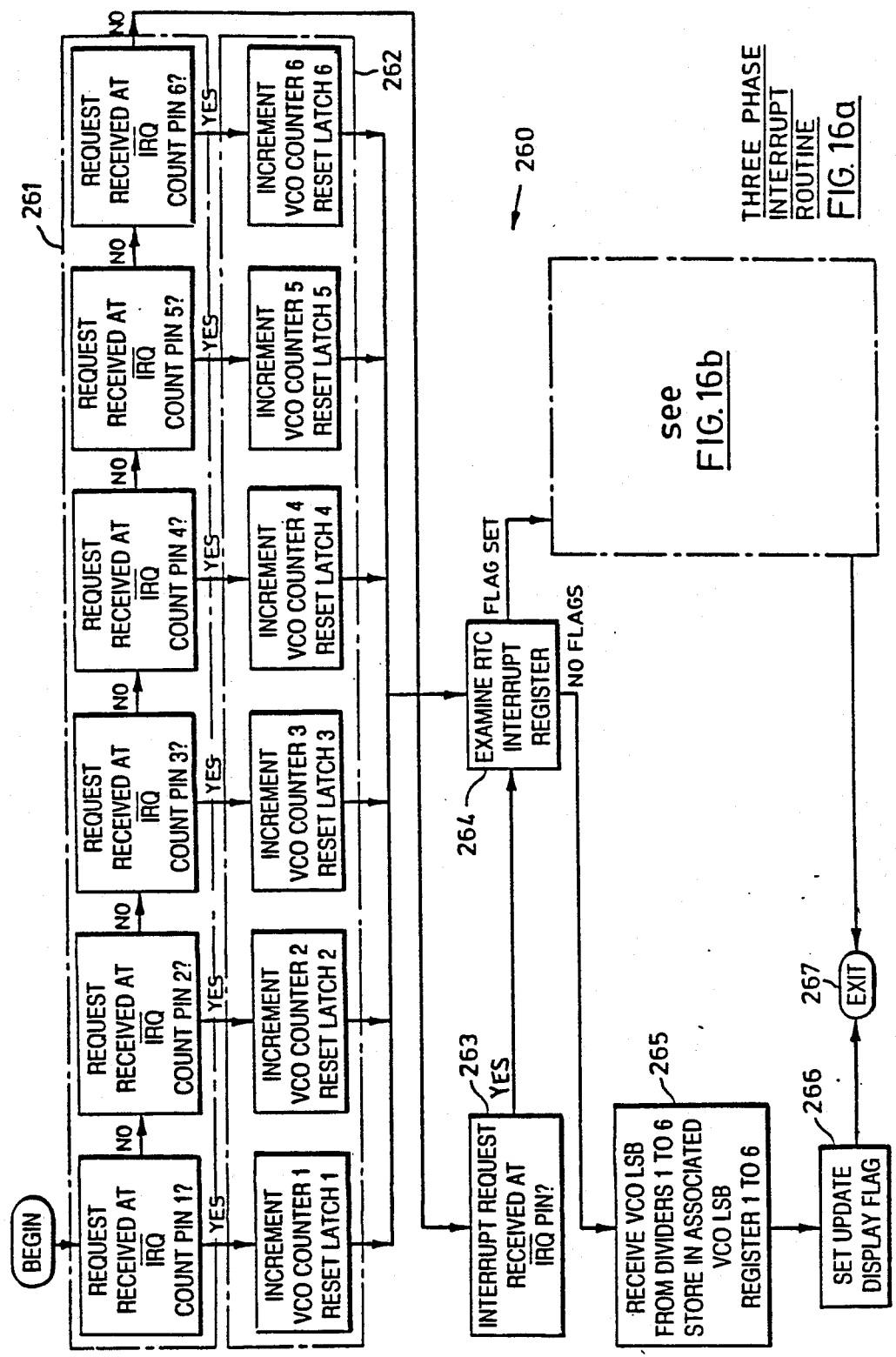

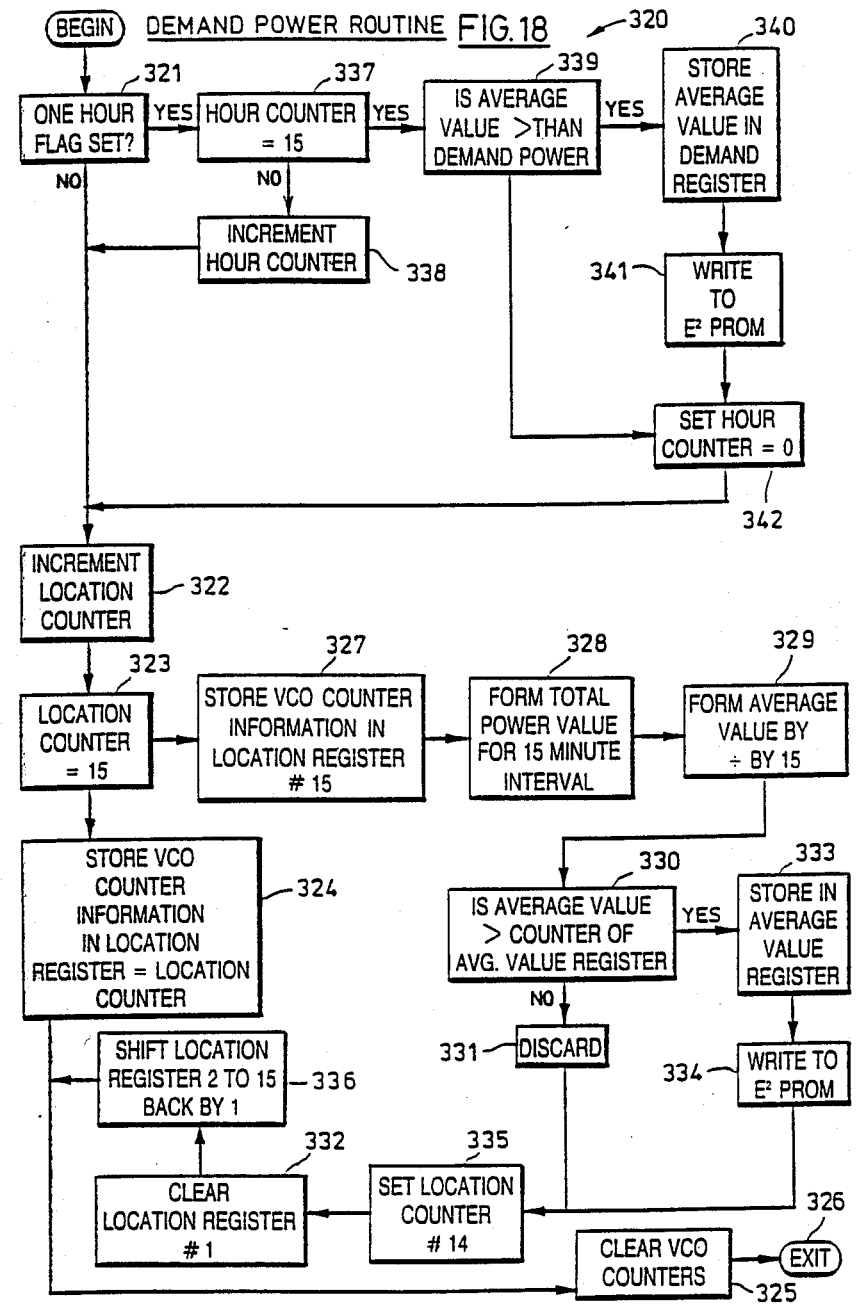

CONSUMPTION METER FOR ACCUMULATING DIGITAL POWER CONSUMPTION SIGNALS VIA TELEPHONE LINES WITHOUT DISTURBING THE CONSUMER

The present invention relates to a meter and in particular to a consumption meter.

Consumption meters are well known in the art and used by various utilities to measure the electricity, gas or water consumption of a consumer. For example, one type of conventional electrical consumption meter monitors and accumulates the single phase power consumption of the consumer. A second type of conventional meter, namely a three phase electrical consumption meter, monitors and stores the highest demand power and the total kilo-watt hours of power consumed per billing period.

However, a problem exists with these conventional meters in that the utilities would like to have the ability to store the power consumption depending on the time of day that it was consumed. Thus, consumers that use power during non critical-load times can be rewarded and consumers that use power during critical-load times can be penalized.

Furthermore, most conventional meters require manual inspection in order for the utility to record power consumption, a process which is expensive and time consuming. To eliminate this problem, conventional meters make use of modems, in order to transfer, the measured power consumption over telephone lines. However, this is undesirable as it requires the consumers to make manually the connection. A permanent link to the modem via a separate telephone line can be used. However, the cost associated with this method renders it impractical.

It is therefore an object of the present invention to obviate or mitigate the above disadvantages by providing a novel consumption meter.

According to the present invention there is provided a microprocessor controlled consumption meter to be associated with sensors for sensing the consumption of a utility comprising:

a real time clock operable to generate timing signals to divide a predetermined time period into a plurality of intervals, said intervals defining critical and non-critical utility consumption times;

processing means communicating with said sensors and responsive to said timing signals for detecting and storing the utility consumption separately for each of said intervals; and accumulation means for accumulating separately the stored utility consumption for each of said intervals over a plurality of said time periods.

In another aspect of the present invention there is provided a microprocessor controlled utility consumption meter to be associated with sensors for sensing the consumption of the utility comprising;

a real time clock operable in first and second modes, in said first mode, said real time clock generating first timing signals to divide a pre-determined time period into a plurality of consumption demand intervals, said consumption demand intervals defining critical and non-critical utility consumption times and in said second mode, said clock generating second timing signals for separating said predetermined time period into a plurality of equal segments;

processing means communicating with said sensors and in said first mode being responsive to said first timing signals and detecting and storing the utility consumption separately for each of said intervals, in said second mode, said processing means being responsive to said second timing signals and monitoring each of said segments in said time period and storing the largest utility consumption occurring in a segment; and accumulation means for accumulating separately, the stored utility consumption for each of said intervals over a plurality of said time periods in said first mode and in said second mode, said accumulation means comparing the largest utility consumption occurring in a segment over said plurality of time periods and storing said largest consumption occurring in a segment.

Preferably, the kilo-watt-hour consumption meter is also provided with:

access means for allowing a transmission link between a remote location and said consumption meter to be established; and interface means communication with said accumulation means, said interface means conveying said interface means conveying said utility consumption stored in said accumulation means upon receipt of appropriate commands from said remote location.

Embodiments of the present invention will now be described by way of example only with reference to the accompanying drawings in which:

FIG. 15 is a schematic view of another embodiment of the portion illustrated in FIG. 5;

FIGS. 16a–16b are flow diagrams of a functional aspect of the device illustrated in FIGS. 13 to 15;

FIG. 18 is a flow diagram of yet another functional aspect of the device illustrated in FIGS. 13 to 15.

Figure 1:
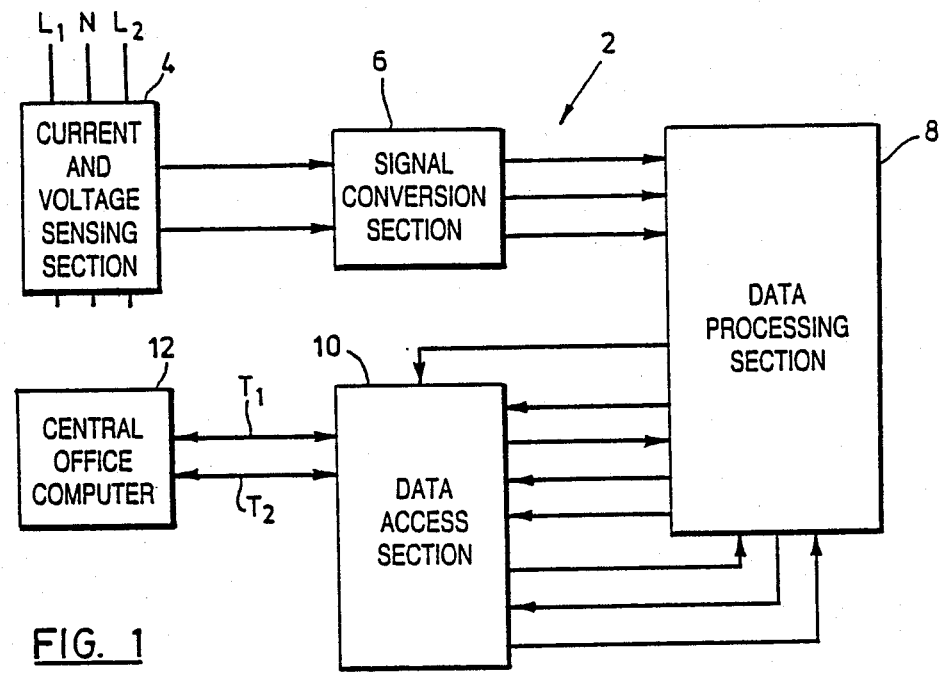
FIG. 1 is a schematic diagram of an embodiment of a kilo-watt-hour utility consumption meter.

Referring to FIG. 1, a kilo-watt-hour utility consumption meter 2 is shown having a current and voltage sensing section 4 and a signal conversion section 6. Current and voltage sensing section 4 is connected to the utility power lines $L_1$ and $L_2$ and senses the current and voltage drawn by the consumer therefrom. Sensing section 4 generates signals which represent the current and voltage respectively, and conveys the signals to conversion section 6 wherein they are converted into power consumption data. A data processing section 8 receives and stores the power consumption data in specific registers located therein that are allocated for specific time periods of the day. A data access section 10 is also connected to data processing section 8 and enables the stored power consumption data to be transferred from data processing section 8 to a central office computer 12 located at the utility headquarters via telephone lines $T_1$ and $T_2$.

Figure 2:
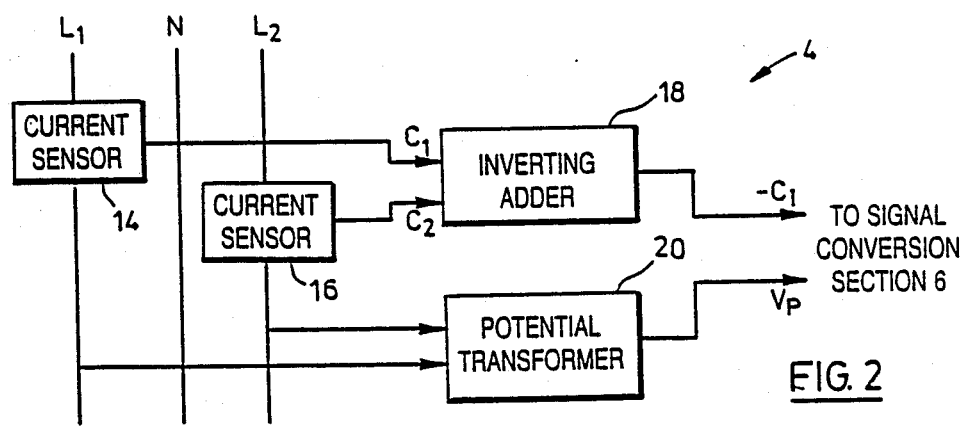
FIG. 2 is a schematic diagram of a portion of the device illustrated in FIG. 1.

The current and voltage sensor section 4 is shown in FIG. 2, having two current sensors 14 and 16, which monitor the current drawn from power lines $L_1$ and $L_2$ respectively. Each of the current sensors 14 and 16 conveys an analog signal $C_1$ and $C_2$ representing the respective measured current to an inverting adder 18. The adder 18 in turn forms an inverted analog scaled current signal $-C_I$. A transformer 20 is also connected to power lines $L_1$ and $L_2$, to measure the potential line to line voltage thereacross, and forms an analog scaled voltage signal $V_P$.

Figure 3:
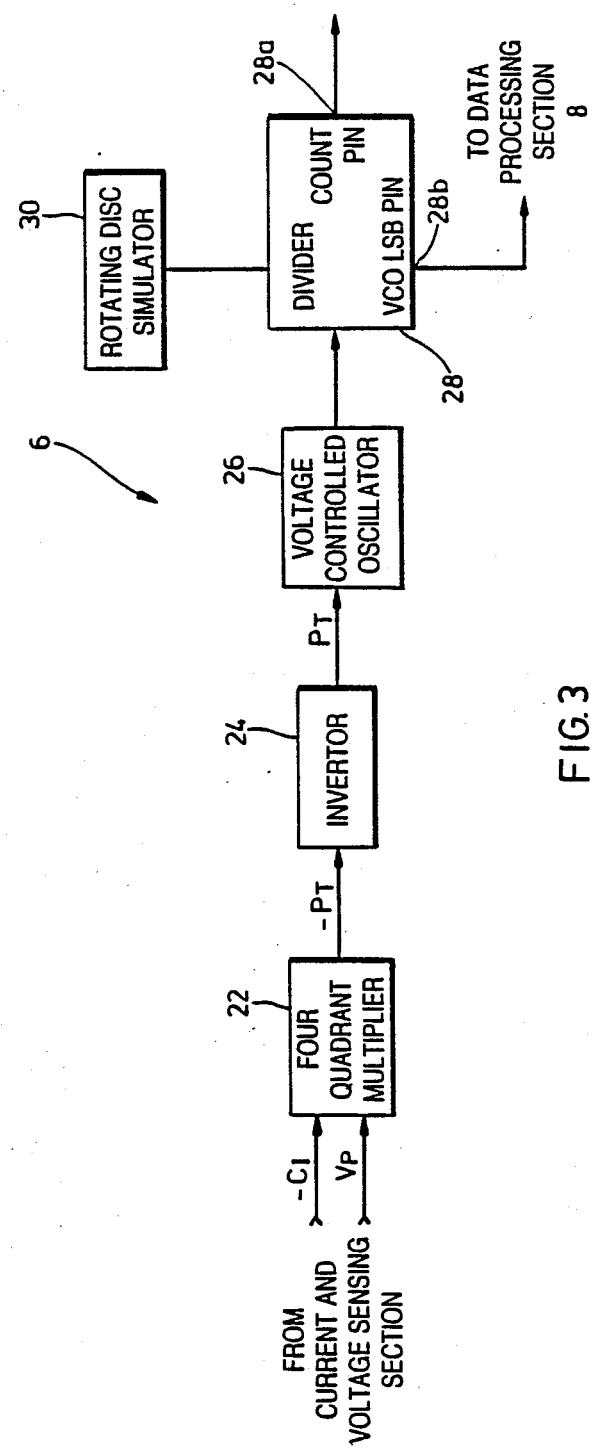
FIG. 3 is a schematic diagram of another portion of the device illustrated in FIG. 1.

Referring now to FIG. 3, the signal conversion section 6 is shown comprising a multiplier 22, an inverter 24, a voltage controlled oscillator (VCO) 26, a divider 28 and a rotating disc simulator 30. Multiplier 22 receives the analog current and analog voltage signals $-C_I$ and $V_P$ respectively and forms an analog product output $-P_T$ representing the instantaneous power consumption of the consumer. The product signal is applied to the VCO 26 by way of inverter 24 which serves to reverse the polarity of the signal. VCO 26 converts the product output $P_T$ into square wave pulses that are conveyed to divider 28. Divider 28 having count and VCO LSB output pins 28a and 28b respectively provides scaled output signals to the rotating disc simulator 30 and to data processing section 8. The output from the divider 28 to the processing section 8 is in the form of an input port. Rotating disc simulator 30 receives the output from the count pin 28a and simulates the rotating dial found in conventional meters via an LED display.

Figure 4:
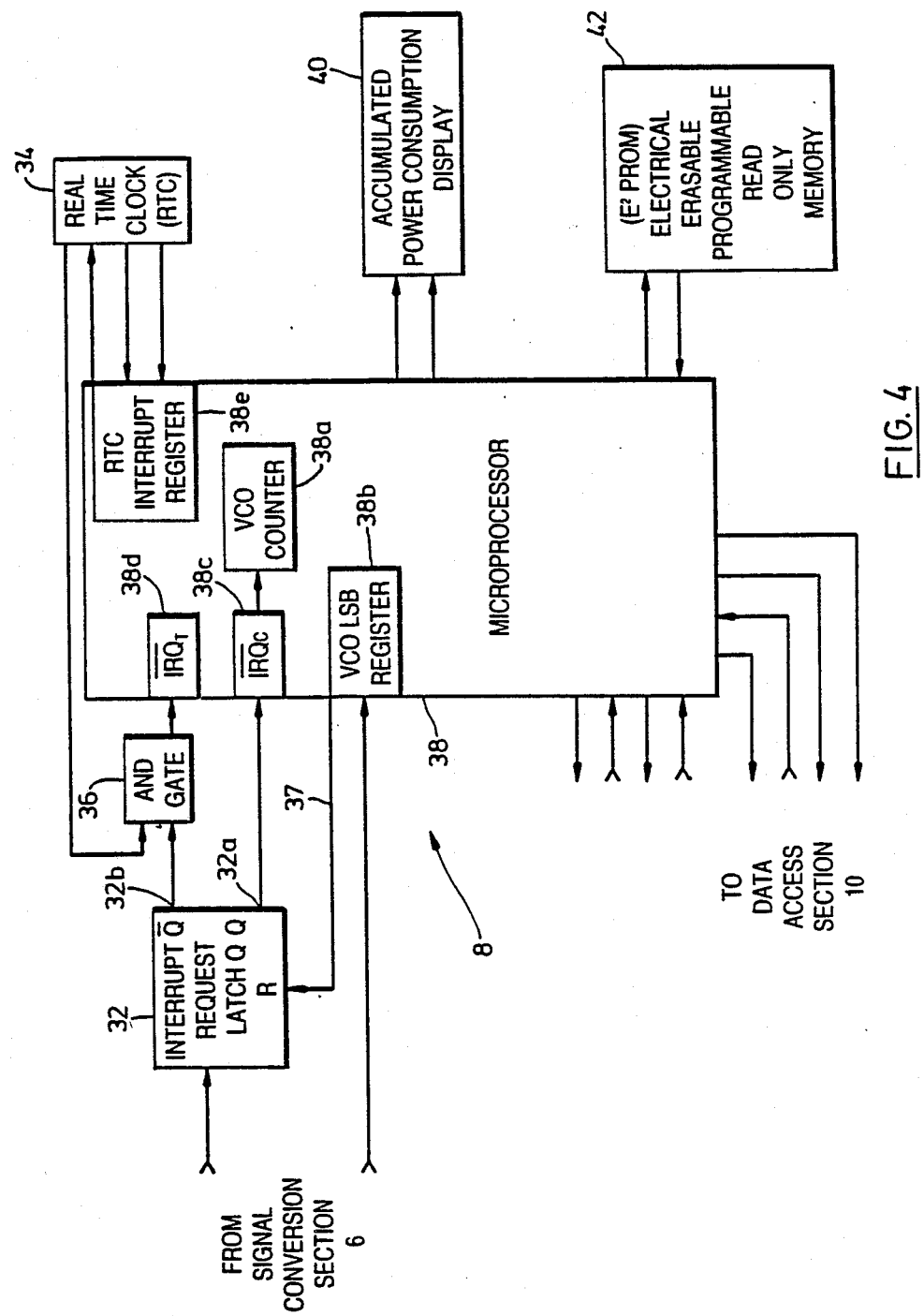
FIG. 4 is a schematic diagram of yet another portion of the device illustrated in FIG. 1.

Data processing section 8 is shown in FIG. 4 and serves to accumulate the power consumption data for a number of pre-determined time periods or intervals over a plurality of time zones. The accumulated data is stored in a plurality of registers that are allocated for each time period or interval. Data processing section 8 includes a microprocessor 38 having a VCO counter 38a and a VCO LSB register 38b for accumulating the power consumption data therein. The data in these registers is transferred to an electrical erasable programmable read only memory (E²Prom) 42 which similarly has registers therein allocated for the power consumption data for each specific time period or interval. Furthermore, the E²Prom 42 is provided with enough registers to store and hold the power consumption data for a current billing period and for the previous two billing periods.

Microprocessor 38 is also provided with an interrupt request count ($IRQ_C$) pin 38c that increments the VCO counter 38a upon detection of a pulse generated from a Q pin 32a of an interrupt request (IRQ) latch 32. IRQ latch 32 receives the output from the count pin 28a which causes the latch to set, thereby generating a pulse at the Q pin 32a thereof. Furthermore, the VCO LSB register 38b. This allows the microprocessor 38 to store accurately a measure of all of the power consumption.

Providing the pre-determined time period information to the microprocessor 38 is a real time clock (RTC) 34, which generates signals and conveys them to an interrupt request time ($IRQ_T$) pin 38d located in the microprocessor 38 via an And gate 36 at the start of each time period. Furthermore, the RTC 34 conveys RTC interrupt flags to an RTC interrupt register 38c, thereby informing the microprocessor 38 and the E²Prom 42 when each time period is starting and finishing. The timing signals generated by the RTC 34 are alterable and when it is desired to change the interrupt timing information, the information, the desired changes are conveyed to the RTC 34 by the microprocessor 38 the details of which will be described hereinafter.

IRQ latch 32 also has a $\overline{Q}$ output pin 32b that is also connected to And gate 36, and serves to prohibit interrupt requests from arriving at the $IRQ_T$ and $IRQ_C$ pins simultaneously.

Data processing section 8 further comprises an accumulated power consumption display 40 which receives data from the microprocessor 38 and displays the total accumulated kilo-watt-hours of power consumed via a number of seven segment LED arrays.

Figure 5:
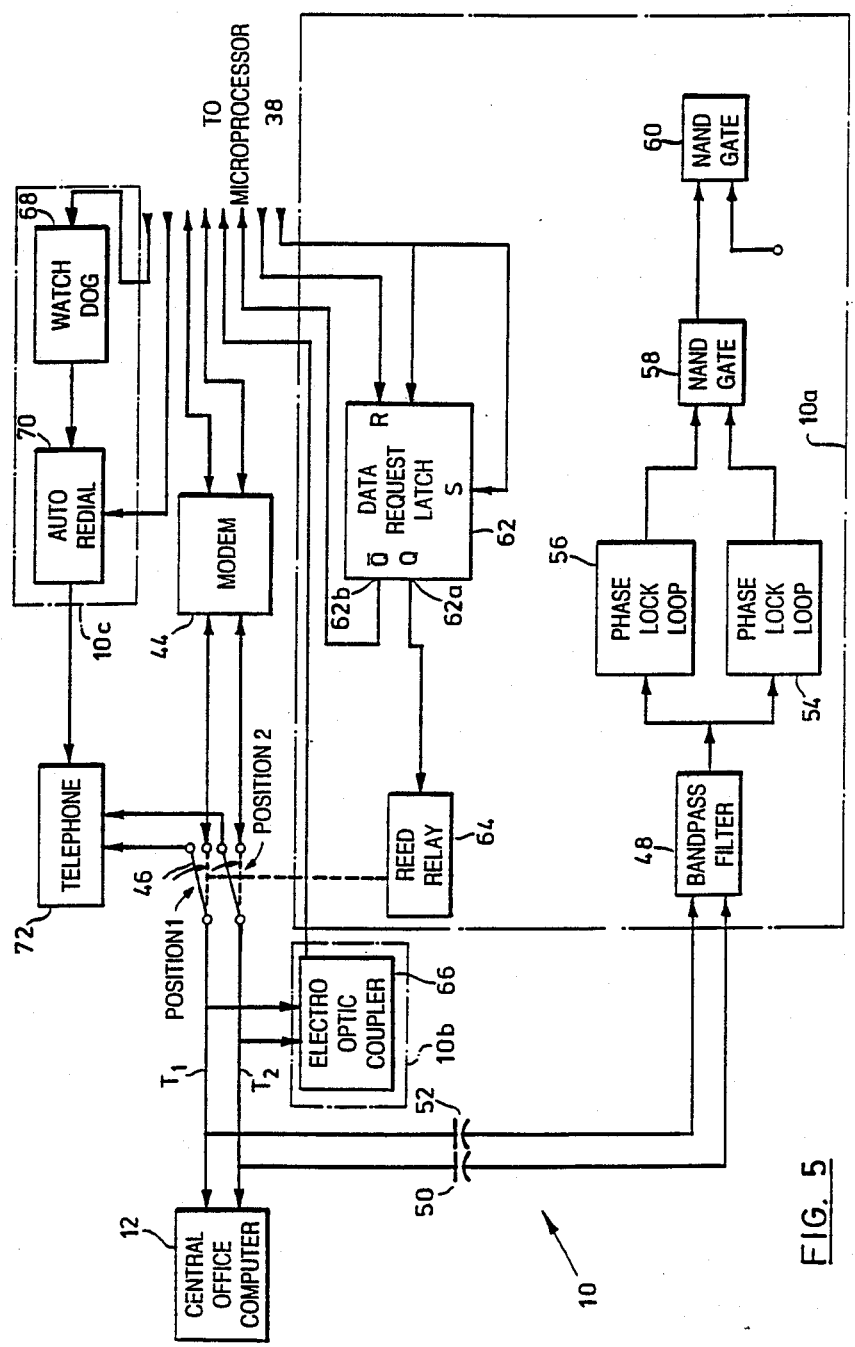
FIG. 5 is a schematic diagram of still yet another portion of the device as illustrated in FIG. 1.
Figure 6:
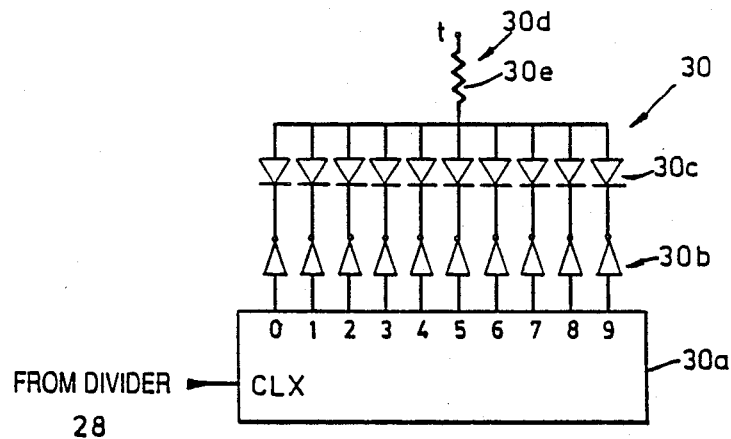
FIG. 6 is a schematic diagram of an element of the portion illustrated in FIG. 3.
Figure 8:
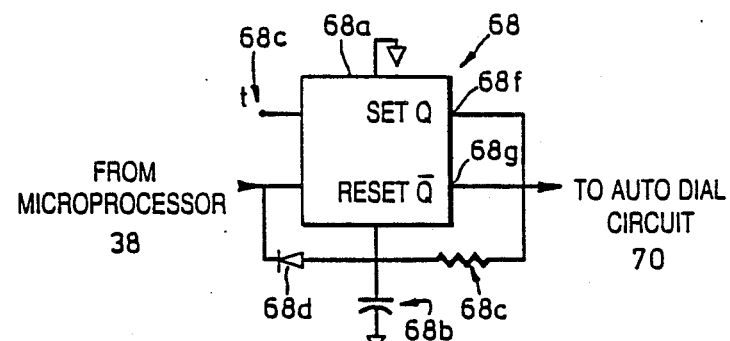
FIG. 8 is a schematic diagram of an element of the portion illustrated in FIG. 5.
Figure 10:
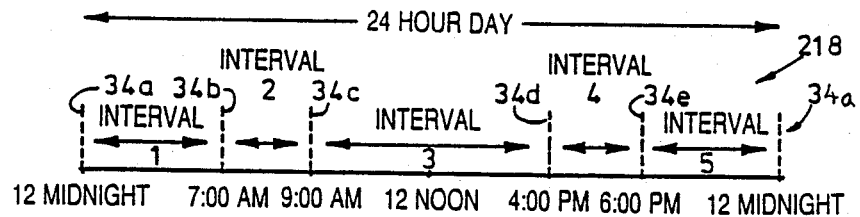
FIG. 10 is a flow diagram of another functional aspect of the device illustrated in FIG. 1.
Figure 7:
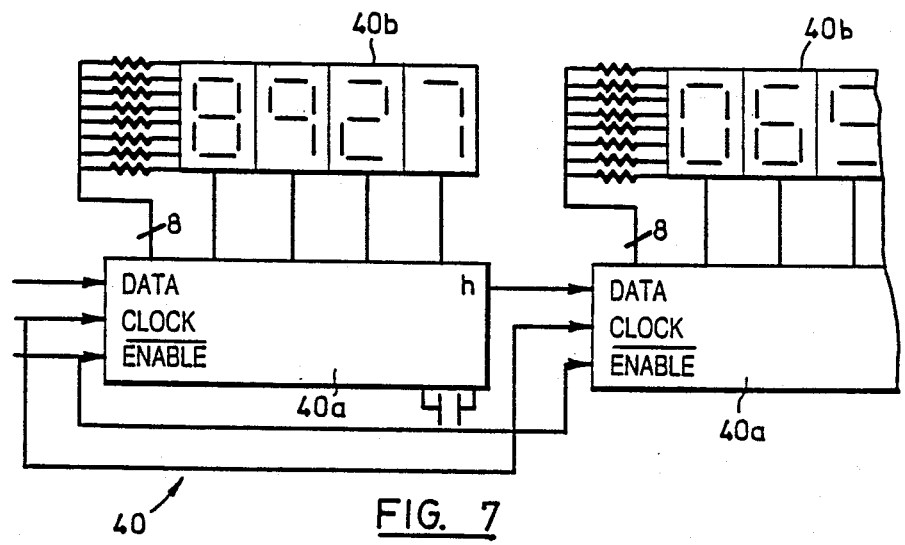
FIG. 7 is a schematic diagram of yet another element of the portion illustrated in FIG. 4.
Figure 9A:
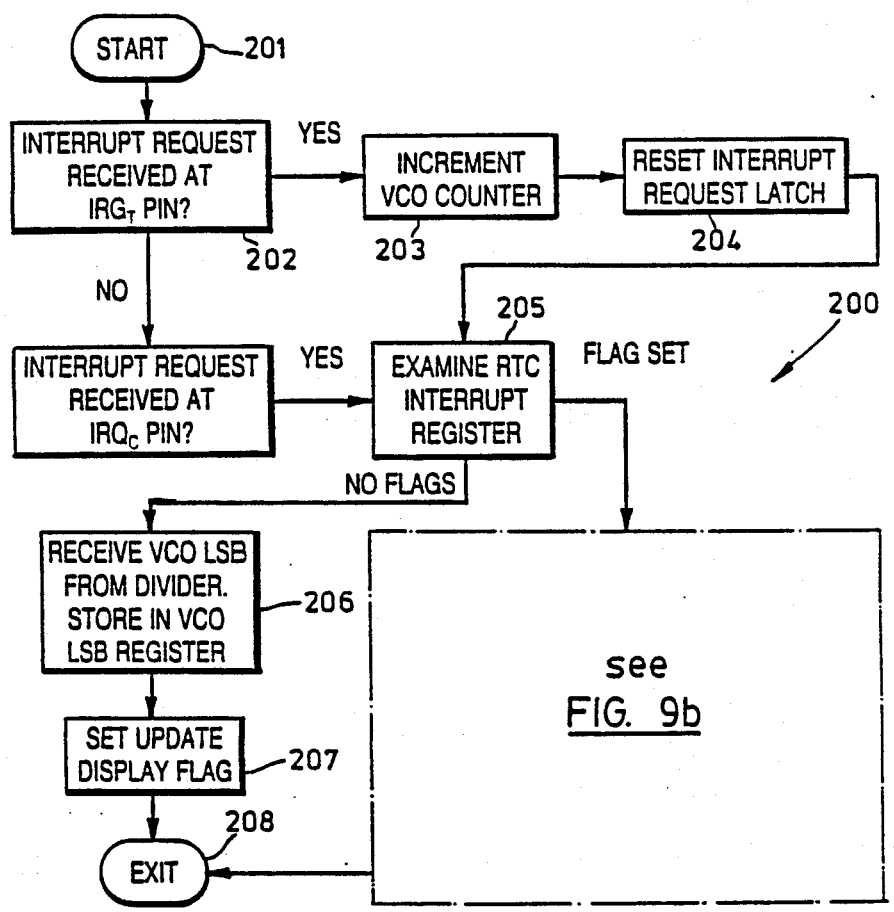
FIGS. 9a–9b are flow diagrams of a functional aspect of the device illustrated in FIG. 1.
Figure 9B:
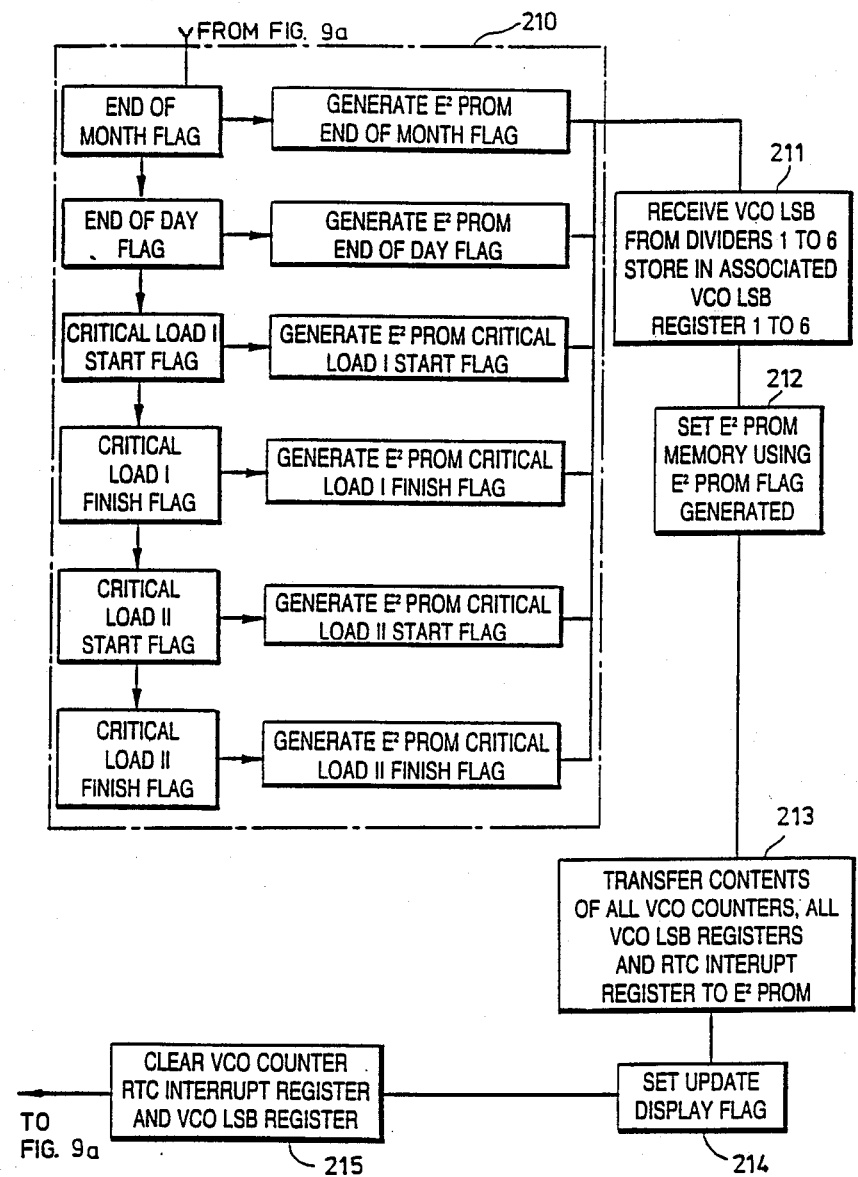

Referring now to FIG. 5, data access section 10 which governs the flow of data between the microprocessor 38 and the central office computer 12 via the telephone lines T and $T_2$ is shown. The section includes a modem 44 connected to microprocessor 38 at one end and to the telephone lines $T_1$ and $T_2$ via a double-pole single-throw switch 46 at the other end. The switch 46 is normally in a position to couple a telephone 72 to the telephone lines but is operable to disconnect the telephone and in turn connect the modem to the telephone lines. Data access section 10 further comprises a detection and coupling section 10a, a status indication section 10b and a malfunction detection section 10c. Coupling section 10a connects the modem 44 to the telephone lines upon reception of a proper code and includes a bandpass filter 48 that is connected to the telephone lines $T_1$ and $T_2$ for receiving the code. Capacitors 50 and 52 serve to isolate bandpass filter 48 from any DC bias that is imposed on the telephone lines $T_1$ and $T_2$, whilst allowing any signal having a frequency greater than O $H_Z$ to pass therethrough (although any signal that is not in passband will be severely attenuated).

The output from bandpass filter 48 (all frequency signals between the filters cut-off frequencies $F_1$ and $F_2$) is conveyed to a pair of phase lock loops (PLL's) 54 and 56 each of which provides a high input to a Nand gate 58 when the correct frequency code is received. Upon reception of the high inputs from the PLLs, Nand gate 58 conveys a logic low signal to a Nand gate 60 which in turn generates an appropriate logic high pulse that is conveyed to a data request latch 62. Data request latch 62 is also connected to the microprocessor 38 and applies a logic high pulse thereto, after a logic high signal has been received from the Nand gate 60. If the telephone handset 72 is detected as being "onhook", the microprocessor 38 informs the data request latch 62 of the handset status. Thereafter, data request latch 62 applies a voltage to a reed relay 64 which energizes the relay, thereby actuating switch 46 from position 1 to position 2. With the switch 46 in this position, information can be transferred between the central office computer 12 and the microprocessor 38 via the modem and the telephone lines.

Status indication section 10b comprises an electro-optic-coupler 66 that is connected across telephone lines $T_1$ and $T_2$. The coupler 66 functions to detect whether the handset of the telephone 72 is on or off the hook. If the telephone 72 is detected as being "offhook", coupler 66 conveys a signal to microporcessor 38 which in turn informs data request latch 62 of the handset status, thereby preventing reed relay 64 from being energized when the telephone 72 is being used.

Malfunction detection section 10c includes a watch dog (retriggerable one shot) 68 and receives a status pulse train generated by the microprocessor 38. If the microprocessor 38 does not function properly and the pulse train fluctuates, the watch dog 68 generates and conveys a signal to an auto redial circuit 70 which in turn generates a dial-out signal to the telephone 72. The dial out signal establishes a connection to the central office computer 12 to inform the utility of a malfunction in operation of the consumption meter 2.

Referring now to FIGS. 1 to 12, the operation of the kilo-watt-hour meter 2 will be described. When measuring the single phase power consumption, the potential voltage across power lines $L_1$ and $L_2$ as well as the current drawn therefrom, must be monitored. Current sensors 14 and 16 are of the type $LEM_{SA}$ LT100-P manufactured by Liason's Electroniques and implement hall effect diodes to generate the analog scaled signals $C_1$ and $C_2$ representing the amount of current drawn from the power lines. The signals $C_1$ and $C_2$ are conveyed to inverting adder 18 which in turn generates a scaled signal $-C_I$, representing a scaled inverted sum of the currents. Potential transformer 20 is also connected across power lines $L_1$ and $L_2$ and forms an analog scaled voltage signal $V_P$ representing the potential voltage across the power lines $L_1$ and $L_2$. Thus, the current and voltage sensing section 4 produces two output signals $-C_I$ and $V_P$, representing the consumed current and voltage respectively and conveys the signals to conversion section 6.

The multiplier 22 is preferably an ICL8013 four quadrant multiplier 22 manufactured by the Intersil Corporation. The multiplier 22 receives the signals $-C_I$ and $V_P$ and performs a multiplication therebetween, thereby forming a product signal $-P_T$, representing the instantaneous power consumed from the lines $L_1$ and $L_2$. The inverting adder 18 used in sensing section 4, reverses the polarity of the current signals and thus, the polarity of the power signal $-P_T$ is opposite as to the actual consumed power. Thus, inverter 24 is used to reverse the polarity of the power signal to form the power consumption signal $P_T$.

VCO 26 receives the power consumption signal $P_T$ from inverter 24 and produces a square-wave output train. The frequency of the outputted square waves is determined by the magnitude of the voltage at the input. As more power is drawn by the consumer, the magnitude of the voltage of the power consumption signal $P_T$ increases and thus, the frequency of the VCO 26 square wave output train increases. Conversely, as less power is drawn, the voltage $P_T$ decreases and thus, the frequency of the VCO 26 square wave output train decreases. The divider 28 is preferably an MC14040B divider 28 manufactured by Motorola. The divider 28 receives the square wave output train and divides the frequency thereof by a predetermined value (in this case 4096), thereby scaling the number of square waves to a value that can be used effectively by the microprocessor 38. Thus, divider 28 outputs one pulse (square wave) for every 4096 pulses that are received from the VCO 26. For example, if the square wave train output from VCO 26 had a frequency of 20,480 $H_Z$, the divider would output 5 pulses per second. The divider 28 supplies two inputs to data processing section 18, the first of which is applied to IRQ latch 32 by way of the count pin 28a and the second of which is conveyed to microprocessor 38 by way of the VCO LSB pin 28b.

When the divider 28 applies a pulse to IRQ latch 32, a logic "high" is generated at the Q pin 32a. This logic "high" (interrupt request) is conveyed to the $IRQ_C$ pin 38c and informs the microprocessor 38 to commence an interrupt routine 200 which will be described hereinafter. The output from the $\overline{Q}$ pin 32b is conveyed to the And gate 36 which also receives interrupt request pulses from the RTC 34. When both high pulses have been received, a logic "high" (interrupt request) is conveyed to the $IRQ_T$ pin 38d. Similarly, When an interrupt request has been received from the And gate 36, the microprocessor 38 commences the interrupt routine 200 stored therein.

After an interrupt request ($IRQ_C$ or $IRQ_T$) has been received and the interrupt routine 200 has been initialized (block 201) the microprocessor 38 examines the status of the IRQ latch 32, in order to determine whether the interrupt request was generated by the RTC 34 or by the IRQ latch 32 as indicated at block 202. If IRQ latch 32 generated the interrupt request, the VCO counter 38a is incremented (block 203), the number of counts therein of which is used to represent a rough measurement of the power consumption. Thus, each increment of the VCO counter represents a fraction of a consumed kilo-watt-hour of power. After the VCO counter 38a has been incremented, the microprocessor 38 applies a reset pulse to the IRQ latch 32, thereby resetting a reset pin R of latch so that it is capable of generating another interrupt request pulse upon reception of another pulse from the divider 28.

Following this, the microprocessor 38 checks the contents of the RTC interrupt register 38e to determine if an interrupt request was generated by RTC 34 as indicated at block 205. This procedure is necessary due to the fact that if interrupt requests are generated by IRQ latch 32 and RTC 34 simultaneously, the microprocessor 38 would only receive an interrupt request from the IRQ latch 32. If the RTC interrupt register contains no RTC interrupt flag, then the microprocessor 38 receives the least significant bit (LSB) of the VCO output from the VCO LSB pin 28b and accumulates this with the previously received values in the VCO LSB register 38b as indicated at block 206. Thereafter, a display update flag is set to inform the microprocessor 38 to update the accumulated power consumption display 40 and the interrupt routine 200 is exited as represented by blocks 207 and 208 respectively.

However, if an interrupt request is received and the IRQ latch 32 has not been set, then the microprocessor 38 directly proceeds to examine the RTC interrupt flag located in the RTC interrupt register 38e, in order to determine which time interval the interrupt request was generated for as indicated at block 205. After performing this, the microprocessor 38 begins a specific routine that is associated with the particular RTC interrupt flag found in the register as indicated by numeral 210. The routine requires that the microprocessor 38 receive the output from the VCO LSB pin 28b, and accumulate this value with the previously received values currently held in the VCO LSB register 38b. Thereafter, an E²Prom location flag is generated by microprocessor 38 and conveyed to the E²Prom 42. This location flag informs the E²Prom 42 which time period the RTC interrupt flag was generated for, so that the data in the VCO counter 38a and the VCO LSB register 38b associated therewith, will be stored in the correct registers of the E²Prom as represented by block 212.

After the E²Prom 42 has received the flag, the contents of the VCO counter 38a, the VCO LSB register 38b and the RTC interrupt flag are conveyed to the E²Prom 42 and stored in the proper registers therein as determined by the location flag as indicated at block 213. After the information has been transferred from the microprocessor 38, the display update flag is set, to inform the microprocessor 38 to update the accumulated power consumption display 40 as illustrated by block 214. Following this, the VCO counter 38a, the RTC interrupt register 38e and the VCO LSB register 38b are cleared as illustrated at block 215 so that the power consumption information for the next time period can be separately accumulated. Thereafter, the microprocessor 38 exits the interrupt routine 200 until another interrupt request is received as shown by block 208.

The RTC 34 operates as a twenty-four-hour clock and generates interrupt request pulses in accordance with the initial interrupt timing information that is stored therein. Initially, the E²Prom is programmed with the interrupt timing information in order to prevent accidental erasing thereof in the event of a power failure. The information is transferred to the RTC 34 from the E²Prom 42 via the microprocessor 38 when the meter is to be installed. The interrupt request pulses are generated at the end of a month, at the end of a day and at the start and finish of critical-load time periods or intervals. Furthermore, a specific RTC interrupt flag is generated for each interrupt request and, conveyed to the RTC interrupt register 38e.

The scheme used to generate the RTC interrupt flags, allows microprocessor 38 to separate a twenty-four-hour day into five time periods and accumulate the power consumption data for these time periods daily, for a complete month. Thus, a monthly billing scheme can be used by the utility and different consumption rates can be charged for the power consumption accumulated for each of the five time periods. The scheme 218 is based on the following and illustrated in FIG. 10.

When an RTC interrupt flag is generated at the end of the day 12:00 midnight, the microprocessor 38 examines this flag and acknowledges that a day is commencing. The next RTC interrupt flag is generated at the start of a first critical-load time in this case 7:00 a.m., thereby informing microprocessor 38 that a first critical-load time period is beginning and that the power consumption information that has accumulated in the VCO LSB register 38b and the VCO counter 38a is associated with the time period extending from the start of the day to the start of the critical-load time period (time period 1). Following this, the information is conveyed to the E²Prom 42 and held in registers that are set aside for this specific time period as described in the interrupt routine 200. When the RTC interrupt flag for the finish of the first critical-load time period is generated in this case at 9:00 a.m., the microprocessor 38 examines the information held in the VCO LSB register 38b and the VCO counter 38a and similarly conveys it to the E²Prom 42 wherein it is stored in different registers that are set aside for the first critical-load period (time period 2).

Similarly, when a RTC interrupt flag is generated at 4:00 p.m. indicating the start of a second critical-load time period, the microprocessor 38 is informed that the data in the VCO counter 38a and VCO LSB register 38b that has accumulated is associated with the time period extending 9:00 a.m. to 4:00 p.m. (time period 3). Furthermore, by generating a second critical-load time period finish flag at 6:00 p.m. and a RTC interrupt flag at the beginning of the next day, and storing the power consumption information that has accumulated in the VCO counter 38a and VCO LSB register 38b for these time periods (time period 4 and time period 5, respectively) in the E²Prom memory, it can be seen that the daily power consumption information is accumulated separately for the five time periods.

When a new day begins, RTC interrupt requests are generated at the same times as the previous day and the power consumption information that has accumulated in the VCO counter 38a and VCO LSB register 38b for each time period is accumulated with the power consumption information held in the E²Prom 42 associated with the same time period of the previous days.

The RTC end of month interrupt flag informs the E²Prom 42 to stop accumulating the power consumption information in the VCO counter 38a and VCO LSB register 38b with the information stored in the E²Prom 42 but rather begin accumulation of the new data in separate registers in the E²Prom 42, thereby separating the accumulated power consumption data on a monthly basis.

Figure 11:
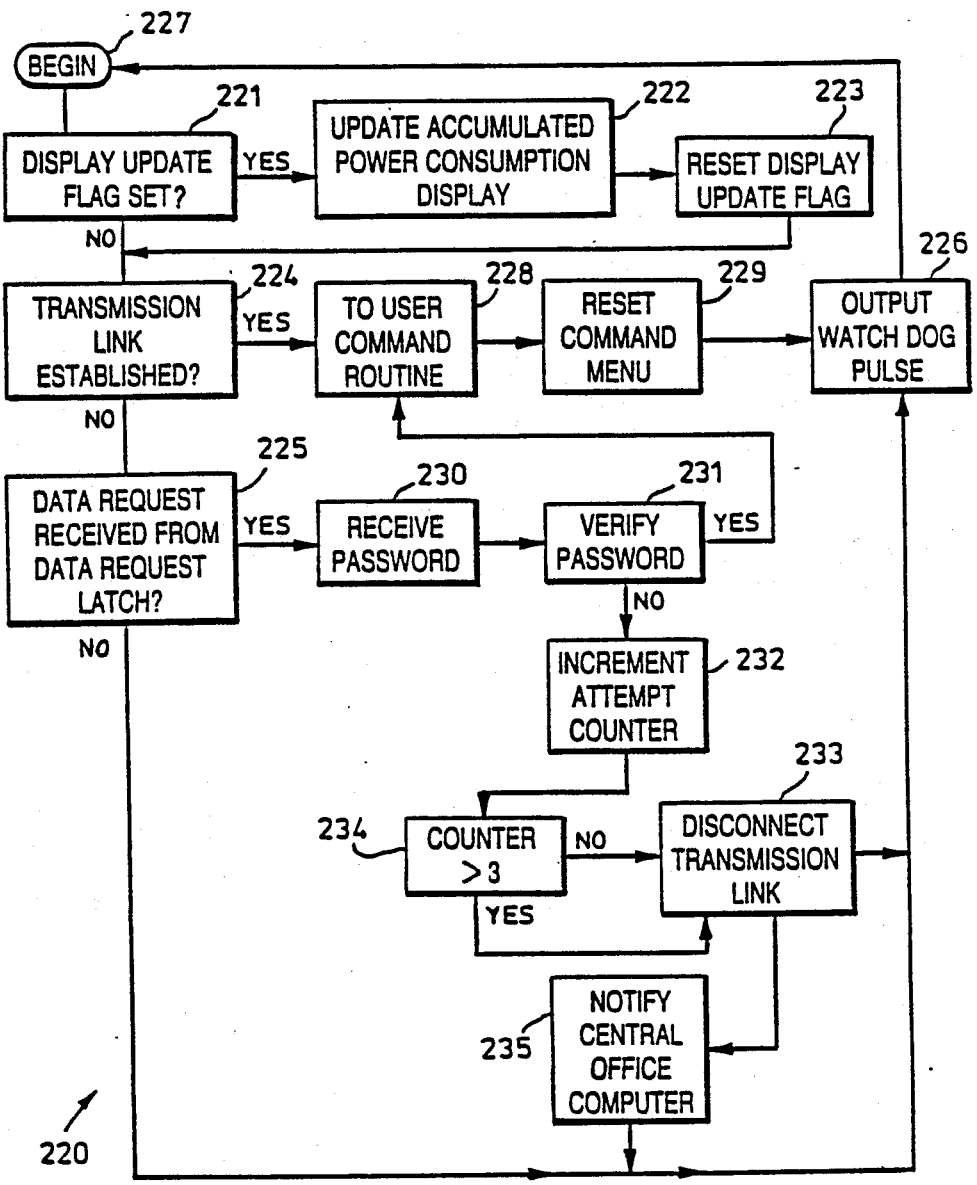
FIG. 11 is a flow diagram of yet another functional aspect of the device illustrated in FIG. 1.

The microprocessor 38 continuously proceeds through a main program routine 220 regardless of whether the interrupt routine 200 is in progress as shown in FIG. 11. During this routine, the microprocessor checks to detect if a display update flag has been set by the interrupt routine as shown in block 221. If a flag has been set, the microprocessor 38 generates an appropriate signal to the display driver 40a of accumulated power consumption display 40. The conveyed signal to the accumulated display 40 causes the display drivers 40a to increment the least significant number in the LED segment arrays 40b and thus, an estimate of the accumulated consumed power is displayed as illustrated at block 222. Following this, the display update flag is reset so that a new update flag can be set as shown at block 223.

After updating the accumulated power display 40 the microprocessor 38 examines the status of the modem 44 to detect whether a transmission link between the central office computer 12 and the microprocessor 38 has been established as shown by block 224. If a link has not been connected, the status of the data request latch 62 is examined in order to detect whether a link is desired as illustrated by block 225. If a transmission link is not desired, a logic high pulse is conveyed to the watch dog 68 and microprocessor 38 recommences the main program routine 220 as shown by block 226 and 227 respectively.

When a pulse is generated from microprocessor 38 to the watch dog 68, the output from a Q pin 68f thereof generates a logic "high", thereby charging a capacitor 68b through a resistor 68c. If the input to watch dog 38 drops "low" before the capacitor 68b resets the Q pin 68f output, a diode 68d discharges the capacitor 68b, thereby preventing the watch dog latch 68a from being reset and hence there is no output from the Q pin 68g thereof. In normal operation, the microprocessor 38 continuously steps through the main program and thus, continuously applies intermittent pulses to the watch dog 68. However, if the input pulses from microprocessor 38 fluctuate, the capacitor 68b will discharge, thereby resetting watch dog latch 68a and thus, the Q pin 68g will provide a logic "high" output. This output is conveyed to auto redial circuit 70, causing a telephone call to the central computer 12 is generated to inform the computer 12 of the improper operation of the meter.

If a data link has been established between microprocessor 38 and the central office computer 12 when the microprocessor is running through the main routine 220, the microprocessor 38 transmits a command menu that lists a number of options that are available to the user at the central office computer 12 as shown at block 228 and commences a user command routine 240 as will be described hereinafter. After the user enters the desired command, the command is conveyed to the microprocessor 38 via the telephone lines $T_1$ and $T_2$ wherein it is performed. Following the completion of the command, the command menu is reset, a pulse is generated and conveyed to the watch dog 68 and microprocessor 38 recommences the main routine again as shown at block 229, 226 and 227 respectively.

If a transmission link has not been established but a data request signal has been received from data request latch 62 requesting a transmission link, the microprocessor 38 requests that the user at the central office computer 12 enter in a password as shown at block 230. If the password entered is correct, the command menu is conveyed to the central office computer 12 and the user command routine 240 commences as shown at blocks 231 and 228. Similarly, the chosen commands entered by the user are conveyed to microprocessor 38 wherein they are performed. When complete, the command menu is reset, a pulse is generated and applied to watch dog 68 and microprocessor 38 recommences the main program routine as illustrated by blocks 226 and 227.

However, if the password entered is incorrect, a call counter is incremented and the microprocessor 38 generates a disconnect signal to data request latch 62, which in turn deenergizes reed relay 64 as illustrated by blocks 226 and 233. Switch 46 which is actuated by the reed relay 64 automatically switches, to position 1 thereby severing the telephone line connection. Thereafter, a pulse is generated by the microprocessor 38 and conveyed to watch dog 68 before the main program is recommenced again as shown by blocks 226 and 227. If another data access request is received from data request latch 62 and the password entered is once again incorrect, then the identical routine is performed. However, when the call counter reaches a value greater than three, the microprocessor 38 generates an output signal to the auto redial circuit 70 after the initial telephone connection has been severed and a telephone link is established between the central office computer 12 and the microprocessor 38 as shown by blocks 234 and 235 respectively. This informs the utility that unauthorized access of the power consumption data stored in the kilo-watt-hour meter 2 is being attempted.

To establish a transmission link with the microprocessor 38, the utility must dial the consumer's telephone number with the use of the central office computer 12. When the telephone connection has been established but before the bell of the telephone 72 rings, a code comprising a pair of signals having frequencies $F_1$ and $F_2$ ($F_2 > F_1$) are generated and each signal is imposed over one of the telephone lines $T_1$ and $T_2$ respectively. The frequency pulses $F_1$ and $F_2$, pass through the respective capacitor 50 and 52 to bandpass filter 48 which allows the frequencies $F_1$ and $F_2$ to pass therethrough, whilst blocking all frequencies greater than $F_2$ and smaller than $F_1$. The two frequency pulses are fed to the respective PLLs 54 and 56 and phase lock in each loop is achieved. With the PLLs in phase lock, a logic "high" output is generated by each loop.

Thereafter, the "high" pulses from the PLLs 54 and 56 are fed to the Nand gate 58 which in turn generates a logic "low" that is applied to the Nand gate 60. Nand gate 60 also receives a "high" input from a power source (not shown) and generates a "high" pulse output when the "low" signal from Nand gate 58 is received. The logic "high" output from Nand gate 60 is applied to the data request latch 62 which in turn generates a logic "high" (data request) that is applied to the microprocessor 38, thereby informing the microprocessor 38 that a telephone transmission link has been requested.

If either one or both of the frequency pulses $F_1$ and $F_2$ are incorrect, yet pass through bandpass filter 48, one or both of the PLLs 54 and 56 will not achieve phase lock and thus, the Nand gate 58 will not receive the desired input. In this case, the Nand gate 58 will generate a logic "high" signal which in turn is conveyed to Nand gate 60. A logic "low" is generated therefrom and applied to data request latch 62. Data request latch 62 ignores this logic "low" and thus, a data request signal is not generated.

Figure 12:
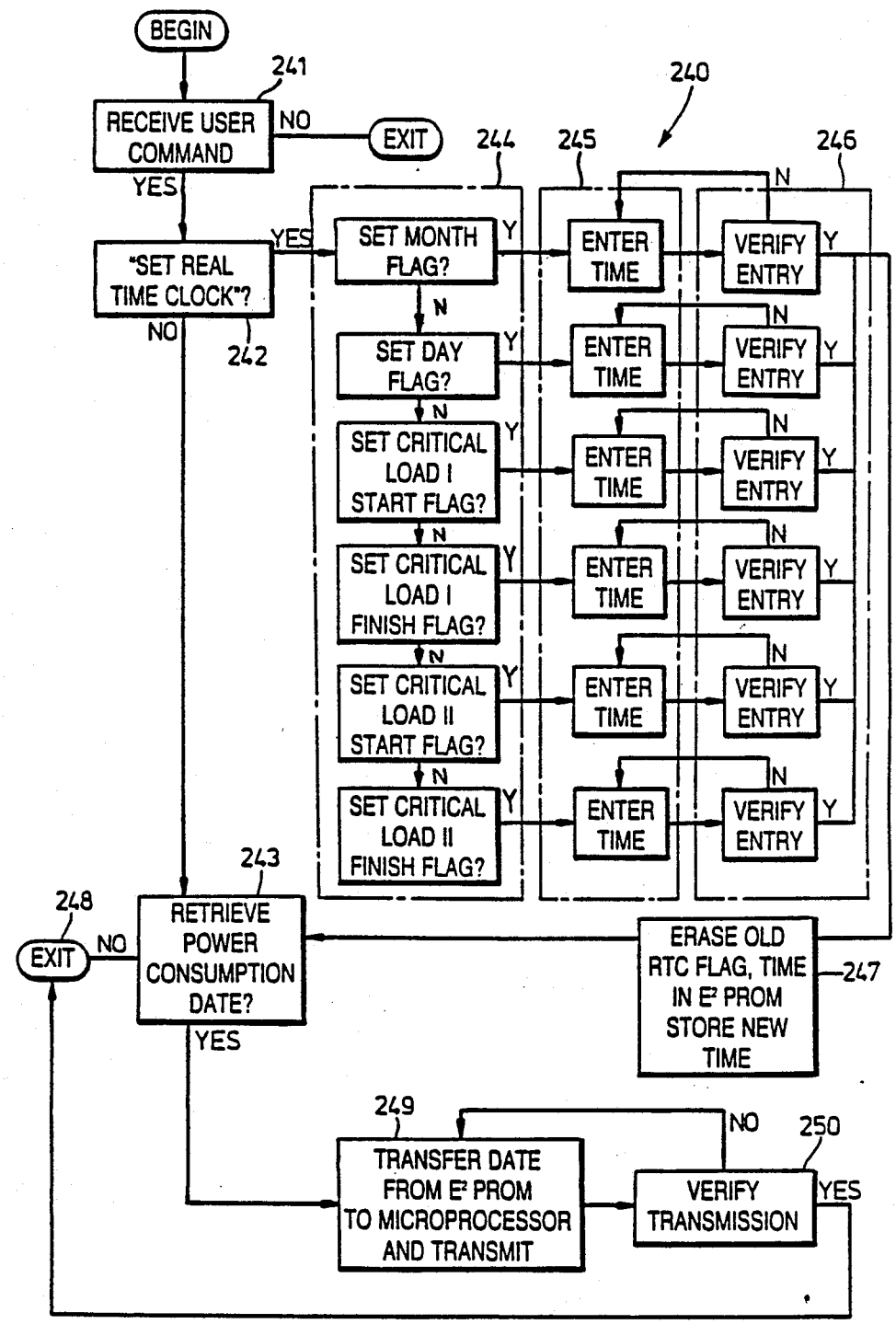
FIG. 12 is a flow diagram of yet another functional aspect of the device illustrated in FIG. 1.
Figure 13:
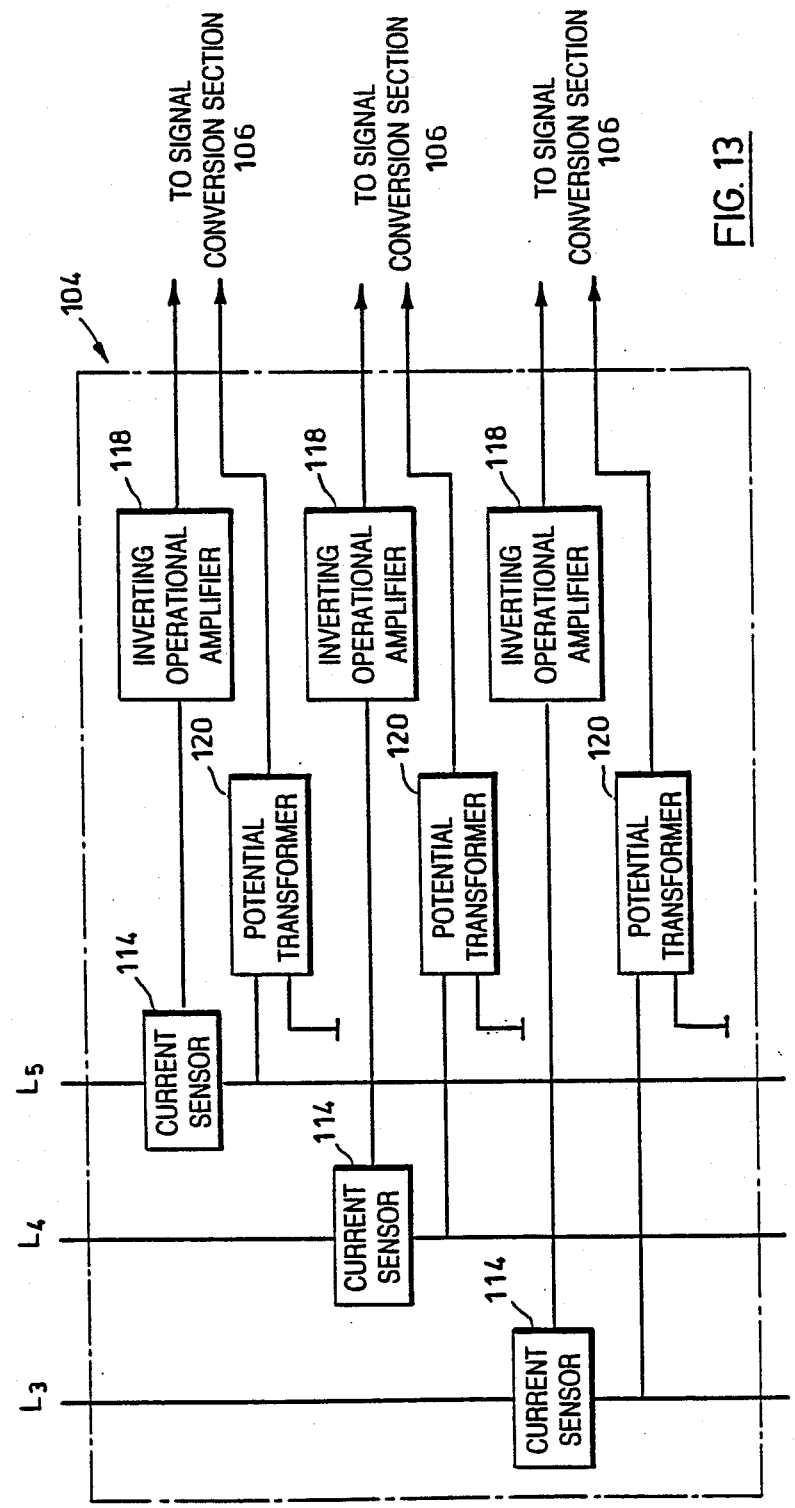
FIG. 13 is a schematic view of another embodiment of the portion illustrated in FIG. 2.
Figure 14:
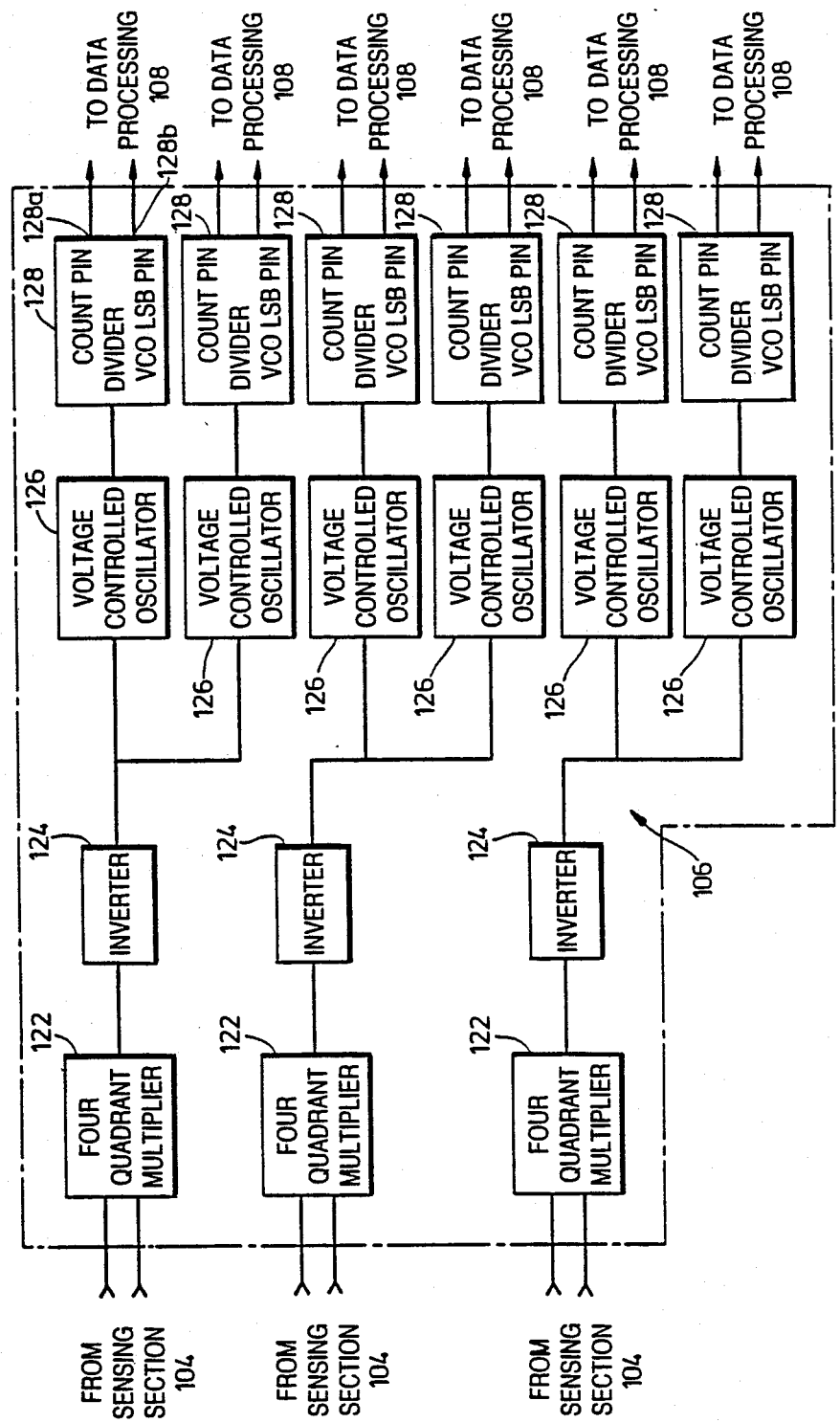
FIG. 14 is a schematic view of another embodiment of the portion illustrated in FIG. 3.
Figure 16B:
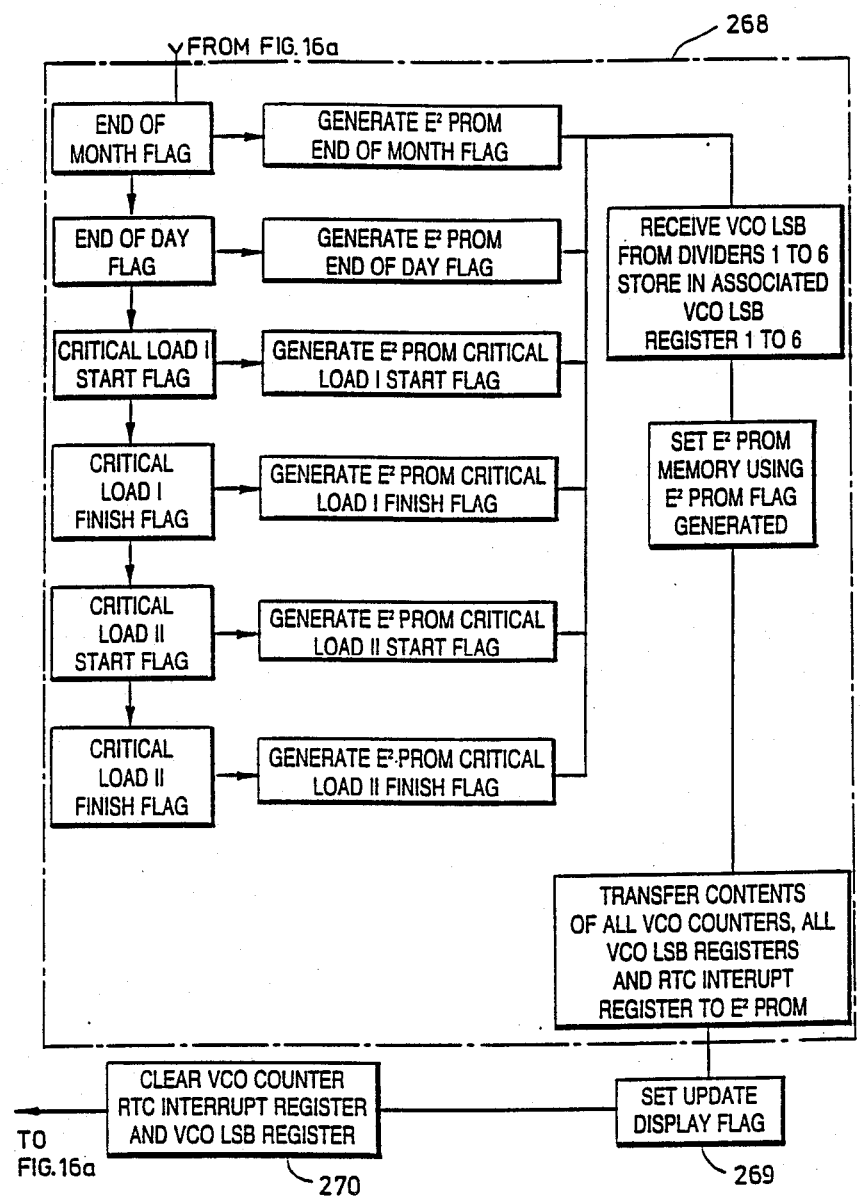
Figure 17A:
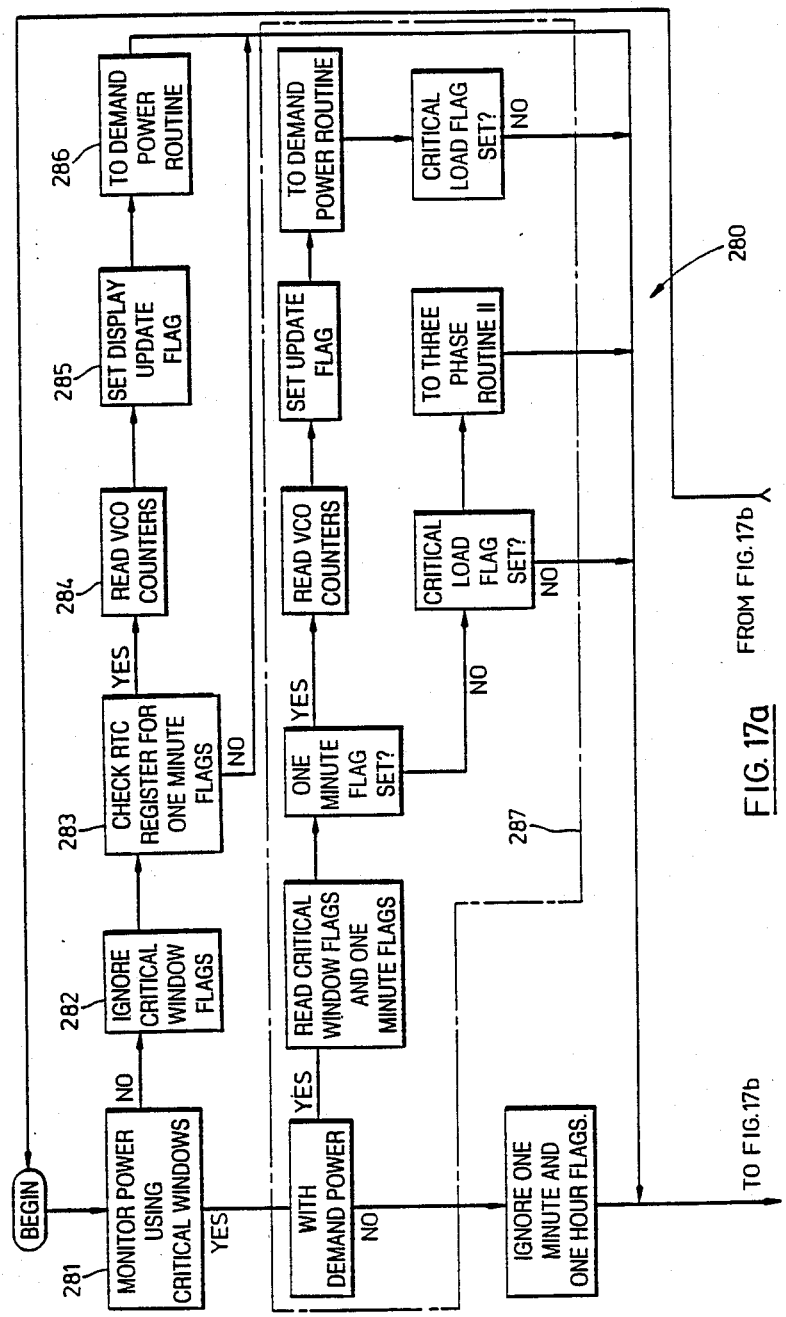
FIGS. 17a–17b are flow diagrams of yet another functional aspect of the device illustrated in FIGS. 13 to 15.
Figure 17B:
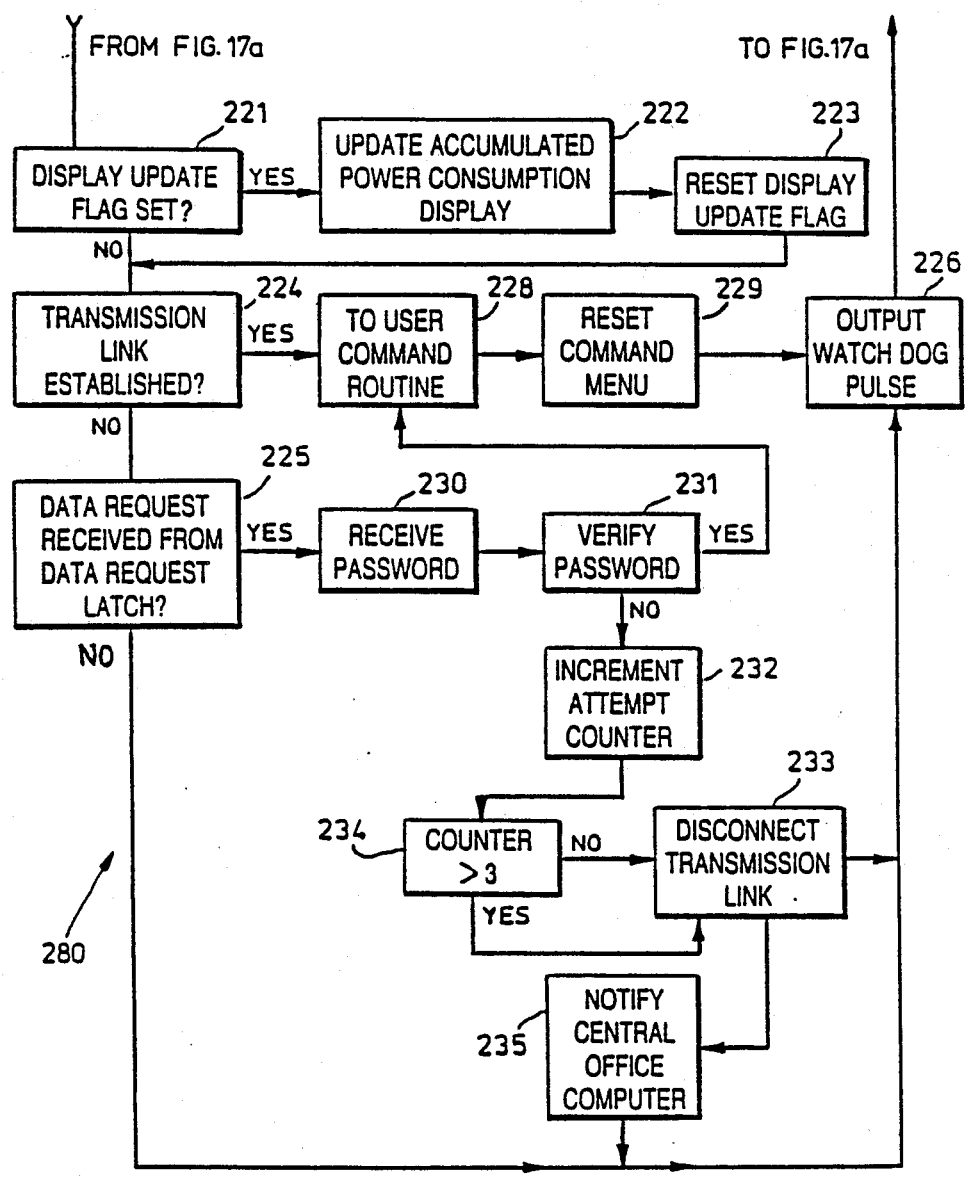

Electro-optic-coupler 66 is also connected to the telephone lines $T_1$ and $T_2$ and monitors the status of the telephone 72 handset. If the telephone 72 is detected as being "onhook", a logic "high" is applied to microprocessor 38. However, if the telephone is detected as being "offhook", the input to the microprocessor 38 drops "low". If the microprocessor 38 detects an "onhook" status when a data request signal is detected, a connect signal is generated by microprocessor 38 and applied to data request latch 62. After receiving the connect signal, the latch 62 applies a voltage to reed relay 64, thereby energizing a coil (not shown) therein, and thus, actuating switch 46 from the telephone terminals (position 1) to modem 44 terminals (position 2). This process is completed before the bell located in the consumer's telephone can ring, thereby allowing the transmission link between the central office computer 12 and the microprocessor 38 to be completed, without disturbing the consumer. With the data link established, the main routine 220 will require the user to enter the appropriate password as described previously. If the password is correct, information can be transferred across the telephone lines $T_1$ and $T_2$ by accessing the user command routine 240 as shown in FIG. 12.

However, if microprocessor 38 detects the telephone handset in the "offhook" position, the data request latch 62 cannot be set and thus, reed relay 64 will not be engerized. The double-pole single throw switch 46 is not actuated and remains connected to the telephone 72. The central office computer 12 will receive a corresponding busy signal from the telephone 72 and another attempt to establish a transmission link must be performed at a later time.

After the data link has been established and the main program routine 220 has asked for and received the correct password, a command menu is sent from microprocessor 38 to the central office computer 12 via the telephone lines $T_1$ and $T_2$ as indicated at block 241. The command menu as illustrated at block 244 has a number of user options such as "set real time clock", "retrieve consumption data", etc. If the user wishes to set the RTC 34, the appropriate command is entered. Microprocessor 38 acknowledges this command and commences the user command routine 230 which causes another display menu to be transmitted to the central office computer 12. The second display menu asks the user to input which RTC interrupt request flags are to be changed as shown at blocks 242 and 243.

For example, if the utility wishes to alter the start and finish times for the two critical-load periods, the appropriate command is entered into the central office computer 12 when it is conveyed to the microprocessor. The microprocessor 38 proceeds to ask the user to input the new starting and finishing times for these critical-load time periods as shown by block 252 and temporarily stores these times in appropriate registers therein. The user is then asked to verify that the starting and finishing times entered are correct as illustrated at block 246. If the entries are incorrect, the user is asked to input the correct starting and finishing times again (block 245).

However, if the entries are correct and verified, a pulse is applied to the E²Prom 42 which erases the original critical-load timing information and the new timing information is transferred from microprocessor 38 to the E²Prom 42 as illustrated at block 247. This process is repeated for each RTC interrupt timing flag that the user wishes to change. When the appropriate changes are complete, the microprocessor 38 asks the user if transmission of the power consumption data is desired as shown at block 243. If the user does not wish to receive the data, the central office computer 12 informs the microprocessor 38 and the user command routine 230 is exited (block 248). Following this, a disconnect pulse is applied to data request latch 62 which in turn deenergizes reed relay 64, thereby actuating switch 46 and terminating the transmission link. With the telephone link disconnected, the new RTC timing information is conveyed to RTC 34 from E²Prom 42 via microprocessor 38 and using this information, a new timing interrupt request sequence is commenced by the RTC 34.

If the user wishes to receive consumption data for a complete billing period, the billing period must firstly be specified since the E²Prom 42 stores the consumption data for the current billing period and the two previous billing periods. When the appropriate command is entered by the user at the central office computer 12, the microprocessor 38 conveys a pulse to the E²Prom 42 which causes E²Prom 42 to transfer the contents of the registers that hold the accumulated consumption data for the five time periods of the desired billing period into separate registers in microprocessor 38. Thereafter, the microprocessor 38 conveys this information to the central office computer 12 as indicated at block 249. When the data has been received, the central office computer 12 verifies the transmission. If the transmission is not verified the data is retransmitted until it is received without error as shown at block 250. When the transmitted data has been verified the central office computer 12 informs the microprocessor 38 and the user command routine 240 is exited (block 298). Following this, the utility informs microprocessor 38 that a disconnection is desired and the appropriate disconnect signal is generated by the microprocessor 38.

After receiving the accumulated consumption data for the billing month, the utility calculates the bill by assessing consumption rates for each of the five time periods. The utility examines the value from the VCO counter 38a and the number of bits from the VCO LSB register 38b for each time zone and calculates the power consumed from that data. For example, if each VCO count represents one-tenth of a consumed kilo-watt-hour (KWH), the data in the VCO counter is divided by ten thereby forming a rough measurement of the number of KWHs consumed. Furthermore, the number of bits in the VCO LSB register 38b is used as a fine measurement of the power consumption. Thus, if five bits in the VCO LSB register is equivalent to one count in the VCO counter 38a, the number of bits in the VCO LSB register is divided by 50, and the result is added to the rough measurement of the number of KWHs, to form an accurate measurement of the KWHs of power consumed. This number is multiplied by the consumption fee rate associated with that time period and the resultant product is the amount billed for that time period for a month. This process is repeated for each time period and each resultant product is summed, thereby forming the final bill for that month.

The kilo-watt-hour meter 2 is also provided with the rotating disc simulator 30 so that the household consumer can detect the rate of power consumption. The rotating disc simulator 30 receives an input from the count pin 28a and comprises a seven segment driver 30a and nine inverters 30b, each of which is connected to a respective pin of the seven segment driver 30a. The output from each inverter 30b is applied to the downstream pin of a single LED segment 30c. The upstream pin of each LED segment 30c is connected to a power supply 30d by way of resistor 30e which serves to limit the current flow through each of the LED segments 30c.

When a square-wave pulse is received by the rotating disc simulator 30, the output of the first pin of the seven segment driver 30a goes "high", thereby causing inverter 30b connected thereto, to convey a logic "low" output to the downstream pin of LED segment 30c. Thus, a potential difference is developed across the first LED segment 30c, and a current flows therethrough, thereby illuminating the LED segment.

When the next pulse is received, the output of the first pin goes "low" and the output of the second pin goes "high". Thus, the first LED segment is turned off, however, the second LED segment is illuminated in the same manner as previously described. This process continues for each square-wave received, thereby illuminating each LED segment in succession and thus, simulating the rotating disc used in conventional meters.

If a power failure occurs when a telephone link has been established between the microprocessor 38 and the central office computer 12, the reed relay 64 deenergizes, thereby actuating switch 46 and automatically restoring the telephone connection between the consumer's telephone 72 and the telephone lines $T_1$ and $T_2$. As a back-up when the utility power fails, the meter 2 automatically establishes a connection to the telephone lines and uses the D.C. voltage supplied thereto to power the RTC 34 such that the clock timing sequence is not lost. Furthermore, in the event of a telephone and utility power failure, a battery (not shown) is provided to energize the RTC 34 for a short period of time until repairs can be made. Moreover, by virtue of the properties of the E²Prom 42, the interrupt timing information and the consumption data stored therein is not lost.

Referring now to FIGS. 13 to 19, another embodiment of the present kilo-watt-hour meter 102 is shown for use with three phase power lines. The meter also includes a current and voltage sensing section 104 and a data conversion section 106. Current and voltage sensing section 104 senses the line to neutral voltage and the current on each of the three phase power lines $L_3$, $L_4$ and $L_5$ respectively. Similar to sensing section 4, the sensing section 104 generates a pair of signals which represent the current and the voltage drawn from each of the three power lines. The resulting six signals are conveyed to the data conversion section 106, wherein the signals are converted into power consumption data that can be interpreted by data processing section 108. Data processing section 108 receives and stores the power consumption data in specific registers located therein depending on both the time of day that the power was consumed and the type of power that was consumed. A data access section 10 identical to that of the first embodiment, is also connected to data processing section 108 and allows the utility to retrieve the stored power consumption data and alter the RTC interrupt request timing information, via telephone lines $T_1$ and $T_2$ without distrubing the consumer.

Current and voltage sensing section 104 includes three current sensors 114, each of which is connected to one of the utility power lines $L_3$, $L_4$ and $L_5$ respectively. Each of the three current sensors conveys an analog signal representing the respective drawn current to one of three inverting operational amplifiers 118 respectively which inverts and scales the input signal. Each of the transformers 120 is connected between a power line and a neutral and generates a scaled analog signal representing the measured potential voltage.

Signal conversion section 106 is shown comprising three multipliers 122, three inverters 124, six VCOs 126, and six dividers 128. Each multiplier 122 receives a current and a voltage signal generated for one of the three power lines and performs a multiplication therebetween. Thus, an analog power consumption signal is formed for each of the three phase power lines. The product output from each multiplier 122 is applied to the respective inverter 124 wherein, the polarity of each of the power consumption signals is reversed.

Due to time lags which can occur between current and voltage in three phase systems, the product output generated from each of the three multipliers can attain negative values. To measure acurately both the positive and the negative values in the three phase power consumption signals, each inverted power consumption signal is separated into its positive (real) component and negative (reactive) component and each component is conveyed to a separate VCO 126. As in the previous embodiment, each VCO 126 converts the power consumption signal received into a square wave output train having a frequency that is dependent upon the input voltage. Similarly, the square wave output train is applied to a corresponding divider 128 having count and VCO LSB output pins 128a and 128b respectively. Each divider 128 scales the number of square waves, thereby allowing data processing section 108 to process the data.

Data processing section 108 includes six interrupt request (IRQ) latches 132, each being connected to an associated divider, and a real time clock (RTC) 134, that functions in a similar manner as RTC 34 of the first embodiment. A microprocessor 138 is also provided having an interrupt request IRQ$_T$ pin 138d and six interrupt request IRQ$_C$ pins 138c each of which is associated with one of the IRQ latches 132 respectively. Each IRQ latch has Q and $\overline{Q}$ output pins 132a, 132b respectively, and, upon reception of a logic "high" (square wave) from the associated count pin 128a, a logic "high" (interrupt request) is generated at the Q pins 132a thereof, and conveyed to the respective IRQ$_C$ pin 138c. The number of interrupt requests received at each of the six IRQ$_C$ pins are separately counted in a respective VCO counter 138a located in the microprocessor 138.

The output from each of the $\overline{Q}$ pins 132b and an interrupt request output from the RTC 134 are applied to the IRQ$_T$ pin 138d of microprocessor 138 by way of an And gate 136. Thus, when an interrupt request is generated from RTC 134 and the output at each Q pin 132d is "high", an interrupt request is conveyed to the IRQ$_T$ pin 138d. Similar to the first embodiment, microprocessor 138 also receives the scaled square wave output from each divider 128 and stores this information in separate VCO least significant bit (LSB) registers 138b.

The microprocessor 138 receives critical-load, end of day and end of month interrupt timing flags from the RTC 134 and stores these flags in an RTC interrupt register 138e, to allow the microprocessor to determine where the accumulated power consumption data is to be stored.

The RTC 134 also generates one minute and one hour flags to the RTC interrupt register 138e, the function of which will be described in more detail hereinafter. However, an interrupt request is not conveyed to the IRQ$_T$ pin 138d with these flags. When the timing sequence of the RTC 134 is to be altered, the RTC 134 receives the new interrupt request timing information from the microprocessor 138 and adjusts the timing sequence thereof, in accordance with this information.

The microprocessor has the capability of processing the information in a number of methods. If the power consumption data is to be stored in accordance with the time of day, the microprocessor is informed and will therefore ignore the RTC one minute and one hour flags that are conveyed to the RTC interrupt registers and functions in the same manner as the first embodiment by implementing the three phase interrupt routine 260 illustrated in FIG. 16.

The microprocessor 138 conveys the power consumption data that has accumulated in each of the six VCO counters 138a and each of the six VCO LSB registers 138b therein to an E²Prom 142 wherein the power consumption information is separately stored in accordance with the time of day that the power was consumed. Similarly, the daily information for each time period is accumulated with the previous daily accumulated consumption data until the information billing period is complete and an end of month flag has been detected. Following the detection of this flag, the consumption data is stored in different registers so that billing period data is separately stored. When it is desired to transfer the billing period information to the central office computer 12 via the telephone lines $T_1$ and $T_2$, the same method as described in the first embodiment is implemented.

However, if the power consumption data is to be monitored in accordance with the highest demand power for an interval of time in this case fifteen minutes, the microprocessor is informed and the one minute and one hour flags will be acknowledged and the critical-load flags will be ignored. This allows the utility to store the highest demand power for an interval of time and the total accumulated power consumed per billing period.

The processing section 108 further comprises an accumulated power consumption display 140 which receives data from microprocessor 138 and displays the total accumulated kilo-watt-hours of power consumed via a number of arrays of seven segment displays.

The operation of the meter 102 will now be described with reference to FIGS. 13–19.

In operation, the current sensors 114 and potential transformers 120 sense the current and the voltage respectively on the connected utility power line, and form scaled analog signals that represent the currents and line-to-neutral voltages respectively. The signal from each current sensor 114 is fed to an associated inverting op-amp 118 wherein the signal is inverted and scaled. The respective outputs from the inverting op-amps 118 and potential transformers 120 are conveyed to a respective multiplier 122, to form an analog product signal representing power consumption. Thus, each multiplier 122 outputs a power consumption signal for one of the three phase utility power lines $L_3$, $L_4$ and $L_5$ respectively.

Each power consumption signal is fed to an inverter 124 wherein the polarity is reversed. The output from each of the three inverters is divided into its real and reactive components respectively, each of which is fed to an associated VCO 126. The square wave output train generated from each of the six VCOs 126 are fed to a corresponding divider 128, wherein the magnitude of the number of square waves is divided by 4096 in order to allow data processing section 108 to process the data. Each divider 128 provides two output signals one of which is fed to the respective IRQ latch 132 by way of count pin 128a and the other of which is applied directly to the microprocessor 138 via VCO LSB pin 128b.

When a square wave pulse is generated from one of the dividers 128, it is conveyed to the respective IRQ latch 132 wherein a logic "high" pulse is generated at the Q pin 132a thereof. This logic "high" is conveyed to the associated IRQ$_C$ pin 138c which informs the microprocessor 138 to commence a routine depending on the method in which the power consumption data is to be stored. The Q pins 132b are connected to And gate 136 which serves to prohibit interrupt requests from occurring simultaneously at the IRQ$_T$ and IRQ$_C$ pins 138c and 138d respectively. As in the previous embodiment, the pulse received at the IRQ$_T$ pin informs the microprocessor 138 that an interrupt request has been generated by RTC 134 and that the three phase interrupt routine 240 should be initiated if the power consumption data is to be stored in accordance with the time of day that the power was consumed.

If the meter is to store power depending on the time of day consumed, microprocessor 138 performs the three phase interrupt routine 260 which is similar to that performed in the first embodiment when an interrupt request IRQ$_T$ is received. To begin, the microprocessor examines the status of each of the six IRQ latches 132 to determine which latch generated the request as indicated at block 261. The associated VCO counter 138a is then incremented and the latch is reset so as to enable it to generate another interrupt request upon reception of a pulse from its associated divider 128 as indicated at block 262. After this has been performed, or if none of the IRQ latches 132 were set, the RTC interrupt register 138c is examined to detect whether the real time clock 134 generated an RTC interrupt request flag whilst ignoring the minute and hour flags as indicated at blocks 263 and 264.

If no RTC interrupt flag is detected, the least significant bit of the VCO input to each divider is received from each of the VCO LSB pins 128b and stored in an associated VCO LSB register 138b as shown by block 265. Following this a display update flag is set (block 267) which informs the microprocessor 138 to update the accumulated power consumption display 140 and the microprocessor exits the routine as shown by block 267.

However, if an RTC interrupt flag is generated, the microprocessor 138 examines which time period generated the flag and stores the contents of all VCO counters 138a, all VCO LSB registers 138b and the RTC interrupt flag in registers of the $E^2$Prom 142 in the same manner as described in the first embodiment as represented by block 268. Similarly thereafter, the display flag is set and the counters and registers are cleared before the program is exited as illustrated by block 269, 270, and 267 respectively.

As in the previous embodiment, the real time clock 134 generates the appropriate interrupt request signals in accordance with the programmed information therein. This information can be changed via the central office computer 12 and the data access section 10 in the same manner as previously described. Similarly, the microprocessor 138 continuously steps through a main program routine 280 shown in FIG. 17. The main program is similar to the program in the first embodiment, however, the additional operation of checking the method of storing the power consumption data is performed. Moreover, the main program routine 280 similarly checks if a transmission link is desired or has been established and if the information that is stored in the $E^2$Prom 142 is to be transferred to the central office computer 12 or if the real time clock information is to be changed, the user must obtain access to the data using the same method as described in the first embodiment.

Thus, the three phase kilo-watt-hour meter stores the real and the reactive power consumed by the consumer for each of the five time periods separately in the $E^2$-Prom 142. After the power consumption data has been accumulated for the current billing period and the two previous billing periods and the utility wishes to calculate a bill, the following method can be used.

The number of counts accumulated in the VCO counters 138a and the number of bits in the VCO LSB registers 138b that are associated with the positive output from each inverter 124 for each of the three phase power lines are added for each time period. This summation forms the total accumulated real power used by the consumer in the time period. Similarly, the number in each of the VCO counters 138a and VCO LSB registers 138b that are associated with the negative output from each inverter 124 are added, thereby forming the total accumulated reactive power used by the consumer in the time period. Thus, the utility is able to hold the accumulated real and reactive power consumption per time period for the current billing period as well as the previous two billing periods. The power factor can also be determined for each time period by dividing the total real power by the sum of the total real power and the total reactive power. Thus, the utility can assess a bill for the consumer's power consumption based on the total accumulated real power, the total accumulated reactive power, the total overall power consumption or the maximum deviation of the power factor from utility and the time of day at which it was consumed.

However, since conventional three phase meters monitor the total overall power consumption per billing period and the highest demand power per fifteen minute interval achieved in a billing period, the present meter 102 allows the user to adopt the conventional method.

To facilitate this, the microprocessor 138 is informed and a demand power routine 320 is implemented when a one minute flag is detected during the progression of the main program routine 280. When the demand power routine is being implemented, the interrupt requests IRQ$_T$ are ignored whilst the IRQ$_C$ requests still are allowed to increment the VCO counters. Thus, the meter monitors demand power for predetermined time intervals and is not concerned the time of day that the highest demand power occurred.

During the main program 280 the microprocessor checks to detect which method of storing data is to be used as shown at block 281. If the demand power method is implemented, the microprocessor checks to detect whether a one minute flag has been set and placed in the RTC interrupt register 138e whilst ignoring the critical-load interrupt requests and critical-load interrupt request flags as indicated at blocks 282 and 283 respectively. If a flag has not been set, the microprocessor ignores the demand power routine 320 and continues through the main program. However, if a one minute flag is detected, the microprocessor 138 reads the VCO counters and VCO LSB registers, sets the update flag and begins the demand power routine 320 as shown at blocks 284, 285 and 286. After entering the routine, the microprocessor then checks to see whether a one hour flag has been set as shown at block 321. If a one hour flag is not detected, a location counter is incremented and then examined to determine its count as illustrated at blocks 322 and 323. If the count therein is less than fifteen, the VCO count in each of the six VCO counters 138a are separately stored in location registers, the register location of which are determined by the value in the location counter as shown at block 324. Furthermore, the information in the VCO counters are processed to form a total power value and stored in an accumulation register located in the E$^2$Prom 142 so that the meter monitors the total accumulated power per billing period. Following this, the VCO counts are cleared, the demand routine 320 is exited as shown by blocks 325 and 326 and the microprocessor returns to the main program.

When the next one minute flag is detected, the demand routine 320 is recommenced. If a one hour flag has not been set and the location counter has reached a value equal to fifteen, the VCO counts that have accumulated in the location registers numbered one to fifteen are processed to form an average total power consumption for that fifteen minute interval as illustrated by blocks 327 to 329. This average consumption value is compared with the value stored in an average value register (block 330) and if it is less than the previously stored average value, the VCO counters are cleared and the accumulated data stored in location register one is deleted as shown at blocks 331 and 332. However, if the average consumption value is greater than the previously stored average value, the average value register is overwritten with the new value, the VCO counters are cleared and the data stored in location register one is deleted as shown at block 333. Furthermore, the average consumption value is written to the E$^2$Prom so that it will not be lost in the event of a power failure. Following either of these procedures, the information stored in location registers two to fifteen is back shifted so that it occupies location registers one to fourteen and the location counter is set to equal fourteen as shown by blocks 335 and 336.

When the next minute flag is detected, the location counter is incremented so that it equals fifteen and the VCO counts stored in the six VCO counters 138a for the three phases are inputted and stored in location register fifteen and accumulated with the contents in the accumulation register. Similarly, the information stored in the location registers one to fifteen is processed to form another average consumption value for the next fifteen minute interval. If this average value is larger than the previous average value, it is stored in the average consumption value register, the VCO counters are zeroed and the information in location register one register is deleted. Similarly, the information stored in location registers two to fifteen is back shifted once again, the location counter is set to equal fourteen and the process continues. This procedure is performed for each detection of a one minute flag until a one hour flag is detected (block 321).

However, when a one hour flag is detected, the previously described process continues for an additional fifteen, one minute intervals incrementing an hour counter for each additional interval until sixty, fifteen minute averages have been calculated for a complete hour as illustrated by blocks 337 and 338. When this has been accomplished, the largest average value stored in the average value register is written to a demand power register and to the E$^2$Prom 142, the average value register is deleted and the hour counter is zeroed as shown by blocks 339–342. Following this, the location counter is set to equal fourteen, the information in location register one is deleted and the information stored in location registers one to fifteen is back shifted by one. When the next minute flag is received, the location counter is incremented by one and the similar process occurs for the next hour interval.

Figure 19:
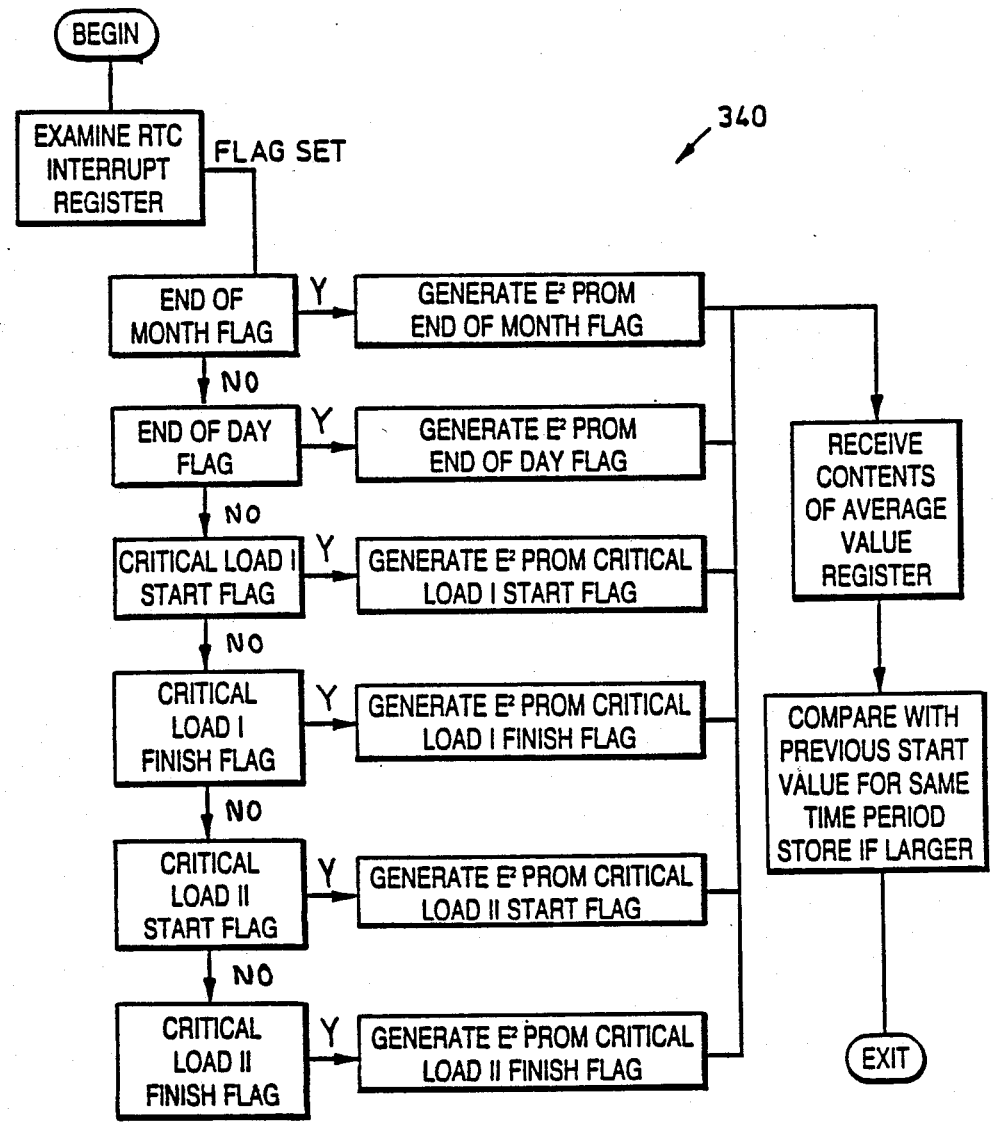
FIG. 19 is a flow diagram of yet another functional aspect of the device illustrated in FIGS. 13 to 15.

Following the completion of the next sixty fifteen intervals for the next hour, the demand power value stored in the average value register is compared with the value stored in the demand power register. The larger of the two values is stored in the demand power register and written to the E$^2$Prom 142 and the other is discarded. When a billing period is complete, the value stored in the demand power register is stored in the E$^2$Prom 142 and can be transferred to the central office computer 12 via the telephone lines so that a consumption bill can be calculated based on the highest demand power value achieved in a fifteen minute interval and the total accumulated power consumption. If desired, the following method can be incorporated with the critical-time intervals such that the highest demand power achieved in critical-load interval and the highest overall demand power achieved per billing period can separately accumulated in the E$^2$Prom for each time period as determined by the generation of IRQ$_T$ interrupt flags by the RTC 134. This method of monitoring the utility consumption can be implemented by performing the steps shown in the main program routine and in the three phase interrupt routine II 340 as illustrated in FIG. 19. Thus, the utility can assess a consumption bill based on the time of day that the highest demand power per specific time of day and per the highest demand period per billing period occurred.

It should be noted that the present meter can monitor power consumption in a number of intervals between each critical-load interval and hold for that time period the largest value of power consumption in each interval. Thus, for example if the utility desires to calculate power consumption bills based on the maximum deviation of the power factor from unity per time period or interval and monitor the maximum deviation per 15 minute intervals, the real time clock 134 can be programmed to generate flags every 15 minutes and the microprocessor 38 registers could be allocated to store the power factor information for each 15 minute interval in a time period. Furthermore, it should be noted that RTC interrupt requests can be generated at any time of the day as desired by the utility by supplying appropriate commands from central office computer 12 and that the day need not be separated into five time periods. Furthermore, the end of month flag may be replaced by weekly, bi-weekly, bi-monthly, etc. flags depending on the billing scheme that the utility wishes to use.

Furthermore, since the meter monitors the power drawn from each of the three phase lines separately, the meter has the capability of detecting unbalanced load conditions by comparing the values stored in the VCO counters for each phase.

Although in present application the central office computer it is used to calculate the power consumption bill, calculations can also be performed in microprocessor 38 by using appropriate software and storing the consumption rates for each time period in separate E$^2$-Prom 42 registers. Thus, only the final bill for each time period or the total monthly bill needs to be transferred via the telephone lines T$_1$ and T$_2$ to the central office computer 12. Furthermore, the demand power method can also be used in the single phase meter by adjusting the main program routine accordingly.

It should be noted that the data access 10 section does not have to be responsive to a pair of superimposed frequencies over the telephone lines. A single high frequency signal can be imposed over the lines and the circuit can be modified to detect a specific number of zero crossings in a predetermined amount of time. Thus, if the specific number of zero crossings are detected, a data access request can be generated and the information stored in the E$^2$Prom can be transferred to the central office computer 12. It should be apparent to one skilled in the art, that a number of detection methods can be used to detect the utility coding signal.

From the foregoing description, it should be appreciated that the microprocessor and the RTC can be programmed to generate interrupt and memory flags for various intervals and thus, power consumption can be monitored in a plurality of time frames to suit the needs of the utility.

Thus, the present kilo-watt-hour meter has a number of advantages in that it stores power consumption data based on the time of day that it was consumed as well as storing data in a manner similar to conventional meters. The data accessing section also allows the consumption information to be accessed quickly without disturbing the consumer.

Furthermore, the present meter can be implemented to monitor the gas or fluid flow through pipelines in a similar fashion by providing pressure and flow sensors in place of the current and voltage sensors.

We claim:

1. A consumption meter to be associated with sensors for sensing the consumption of a utility at a location comprising:
   a real time clock operable to generate timing signals at pre-determined times to divide a pre-determined time period into a plurality of intervals, said intervals defining critical and non-critical utility consumption times;
   processing means communicating with said sensors and being responsive to said timing signals for detecting and storing the utility consumption separately for each of said intervals;
   accumulation means for accumulating separately, the utility consumption stored for each of said intervals over a plurality of said time periods;
   access means for allowing a transmission link between a remote location and said consumption meter to be established over telephone lines; and
   interface means communicating with said accumulation means and said processing means, said interface means allowing said utility consumption stored in said accumulation means to be conveyed to said remote location upon receipt of appropriate commands therefrom, said interface means including a telephone status detector for detecting the condition of the handset of a telephone connected to said telephone lines at said location and disconnect means for disconnecting said telephone from said telephone lines and establishing said transmission link to enable transmission of said utility consumption when said telephone is not in use.

2. A consumption meter as defined in claim 1 wherein said pre-determined time period is defined by a twenty four hour day.

3. A consumption meter as defined in claim 2 wherein said twenty four hour day is divided into five intervals.

4. A consumption meter as defined in claim 3 wherein said timing signals are generated at 12:00 midnight, 7:00 am, 9:00 am, 4:00 pm, and 6:00 pm to define said five intervals, the intervals between 7:00 am to 9:00 am and 4:00 pm and 6:00 pm defining said critical-load intervals.

5. A consumption meter as defined in claim 1 wherein said timing signals comprise first and second interrupt request signals, said first interrupt request signal for informing said processing means of a change in an interval, said processing means receiving said second interrupt request signal and generating therefrom an interrupt request flag, said interrupt request flag indicating the interval that the timing signals define.

6. A consumption meter as defined in claim 1 wherein said real time clock is programmable to allow the pre-determined times at which said timing signals are generated to be changed.

7. A consumption meter as defined in claim 6 wherein said processing means is operable to program said real time clock to determine the times at which said timing signals are generated, said processing means providing information to program said real time clock in response to requests from said remote location, said processing means further including verification means, said verification means requiring the changes in the pre-determined times to be verified by said remote location prior to altering the pre-determined times at which said timing signals are generated.

8. A consumption meter as defined in claim 1 wherein said processing means and accumulation means comprise a microprocessor and an E²Prom, said microprocessor including appropriate software to allow accumulation of said utility consumption in each of said intervals over said pre-determined time periods and the subsequent storing of said utility consumption thereafter in said E²Prom.

9. A consumption meter as defined in claim 1 further including a utility consumption display for displaying the sum of the utility consumption for all of said intervals over all of said pre-determined time periods, said processing means including means to calculate said sum continuously and providing signals to said display to update said display.

10. A consumption meter as defined in claim 1 further comprising a rotating disc simulator, said simulator displaying an indication of the rate at which said utility is being consumed.

11. A consumption meter as defined in claim 1 wherein said sensors detect the current and voltage on utility electrical power lines and wherein said consumption meter monitors and stores the kilo-watt-hours of electrical power consumption.

12. A consumption meter as defined in claim 11 wherein said processing means includes multiplication means forming power signals from the detected current and voltage, pulse generating means for generating a train of pulses in response to said power signals, the frequency of said pulses being dependant upon the magnitude of said power signals and counting means for counting said pulses, the count of said pulses representing said kilo-watt-hours of electrical power consumption.

13. A consumption meter as defined in claim 1 wherein said interface means further comprises ring disable means, said ring disable means disconnecting said telephone from said telephone lines prior to the ringing of said telephone when said telephone is not in use upon request of said transmission link from said remote location.

14. A consumption meter as defined in claim 1 further comprising a malfunction detector, said malfunction detector monitoring the operation of said processing and accumulation means and detecting the improper operation thereof, said interface means also including an auto-dial circuit communicating with said malfunction detector and coupled to said telephone, said circuit establishing a transmission link with said remote location via said telephone upon malfunction of said meter when said telephone is not in use.

* * * * *